United States Patent
Sadaka et al.

(10) Patent No.: US 11,876,348 B2
(45) Date of Patent: Jan. 16, 2024

(54) TRENCH PROCESS FOR DENSE VCSEL DESIGN

(71) Applicant: Apple Inc., Cupertino, CA (US)

(72) Inventors: Mariam Sadaka, Austin, TX (US); Date J. Noorlag, Seongnam (KR)

(73) Assignee: Apple Inc., Cupertino, CA (US)

( * ) Notice: Subject to any disclaimer, the term of this patent is extended or adjusted under 35 U.S.C. 154(b) by 458 days.

(21) Appl. No.: 17/032,673

(22) Filed: Sep. 25, 2020

(65) Prior Publication Data

US 2022/0102940 A1 Mar. 31, 2022

(51) Int. Cl.
  *H01S 5/183* (2006.01)
  *H01S 5/42* (2006.01)
  *H01S 5/40* (2006.01)
  *H01S 5/22* (2006.01)

(52) U.S. Cl.
  CPC ...... *H01S 5/18313* (2013.01); *H01S 5/18327* (2013.01); *H01S 5/18344* (2013.01); *H01S 5/2205* (2013.01); *H01S 5/4025* (2013.01); *H01S 5/423* (2013.01); *H01S 2301/176* (2013.01)

(58) Field of Classification Search
  CPC ............. H01S 5/18313; H01S 5/18327; H01S 5/18344; H01S 5/2205; H01S 5/4025; H01S 5/423; H01S 2301/176
  See application file for complete search history.

(56) References Cited

U.S. PATENT DOCUMENTS

| | | |
|---|---|---|
| 6,658,040 B1 | 12/2003 | Hu et al. |
| 6,782,021 B2 | 8/2004 | Huang et al. |
| 6,917,640 B2 | 7/2005 | Kwak |
| 7,359,419 B2 | 4/2008 | Guenter |
| 8,188,487 B2 | 5/2012 | Ikuta |
| 10,122,152 B1 | 11/2018 | Lin et al. |
| 10,944,242 B2 | 3/2021 | Carson et al. |
| 2004/0241892 A1* | 12/2004 | Colgan ................. H01S 5/423 438/22 |
| 2017/0271851 A1* | 9/2017 | Hanaoka ............... H01S 5/187 |
| 2017/0374244 A1* | 12/2017 | Swaminathan ........ G06F 3/011 |
| 2019/0305522 A1 | 10/2019 | Yuen et al. |
| 2020/0280175 A1* | 9/2020 | Lee ..................... H01S 5/18377 |
| 2020/0350746 A1* | 11/2020 | Yuen .................. H01S 5/04254 |

FOREIGN PATENT DOCUMENTS

| | | |
|---|---|---|
| CN | 110323669 A | 10/2019 |
| EP | 2873124 A1 | 5/2015 |
| TW | 201921819 A | 6/2019 |
| WO | 2014009843 A1 | 1/2014 |

* cited by examiner

*Primary Examiner* — Yuanda Zhang
(74) *Attorney, Agent, or Firm* — Aikin & Gallant, LLP

(57) ABSTRACT

Trenched VCSEL emitter structures are described. In an embodiment, an emitter structure includes a cluster of non-uniformly distributed emitters in which each emitter includes an inside mesa trench and an oxidized portion of an oxide aperture layer extending from the inside mesa trench. An outside moat trench is located adjacent the inside mesa trench and is formed to a depth past the oxide aperture layer.

22 Claims, 18 Drawing Sheets

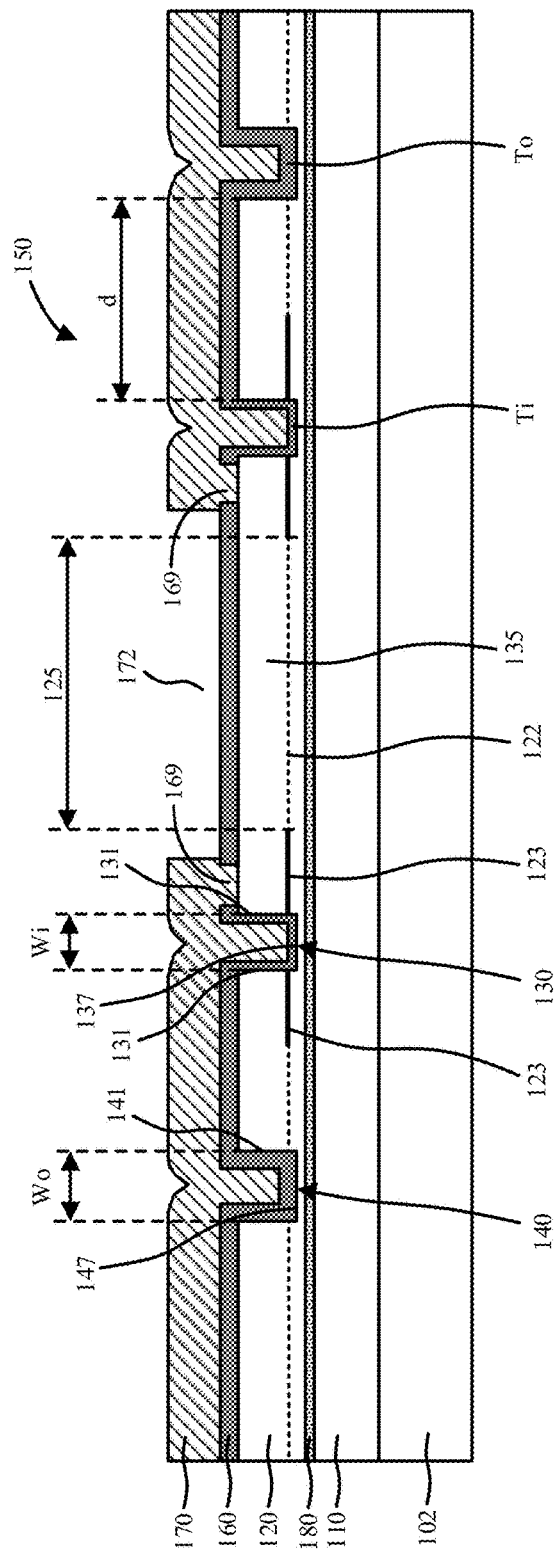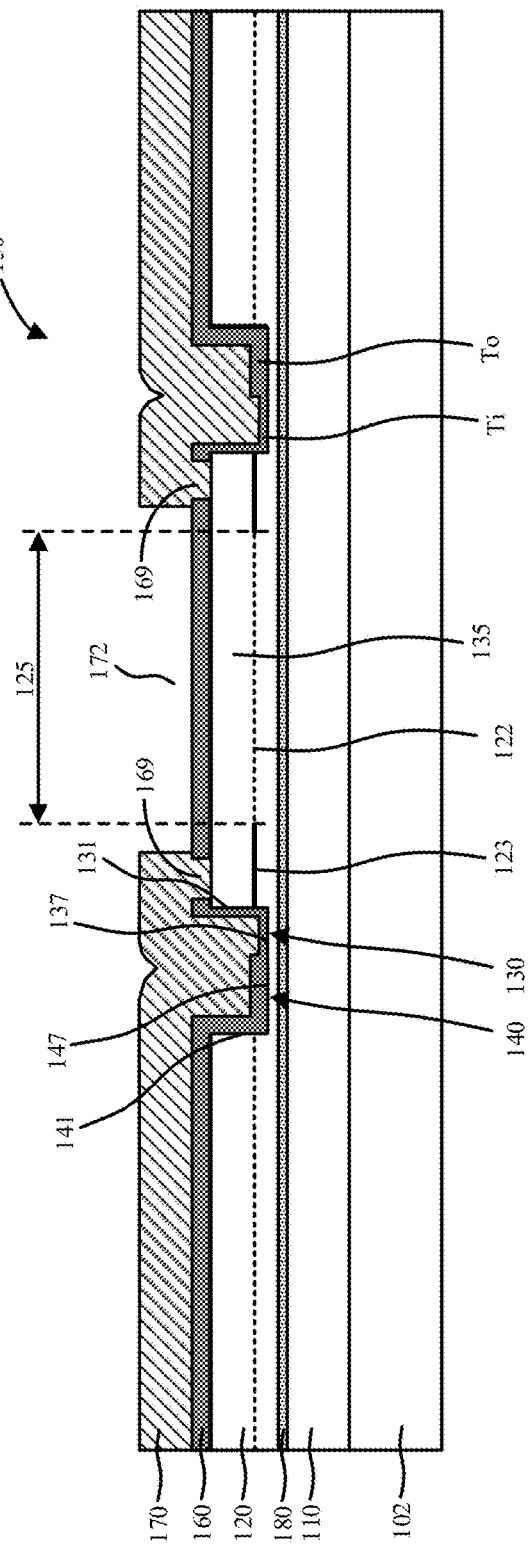

TRENCH PROCESS FOR DENSE VCSEL DESIGN

BACKGROUND

Field

Embodiments described herein relate to emitter structures, and more particularly to vertical cavity surface emitting lasers.

Background Information

Vertical cavity surface emitting lasers (VCSELs) are surface emitting lasers capable of emitting light in a direction perpendicular to the substrate from which the VCSEL is formed. VCSELs may offer a better beam quality compared to other lasers, such as edge emitting lasers. Furthermore, the surface emitting nature allows VCSELs to be patterned into a dense array of mesa-type structures.

A typical VCSEL includes an active layer between top and bottom mirror layers, each constructed of alternating layers of materials with different indices of refraction, also referred to as distributed Bragg reflector (DBR) layers. VCSEL aperture size can be further miniaturized using techniques such as ion implantation or selective layer oxidation to confine current flowing through the VCSEL.

Today VCSELS are commonly used in optical communication links, audio/video appliances, laser scanners, three-dimensional (3D) sensing applications, gesture recognition, and more.

SUMMARY

In an embodiment, an emitter structure includes a cluster of non-uniformly distributed emitters in which each emitter includes an inside mesa trench and an oxidized portion of an oxide aperture (OA) layer extending from the inside mesa trench. An outside moat trench can be located adjacent the inside mesa trench for one or more emitters in the emitter cluster, where the outside moat trench extends to a depth past the OA layer. The outside moat trench may form a physical barrier to moisture ingress and propagation among adjacent emitters. In some embodiments, the outside moat trenches for adjacent emitters are intersected. In some embodiments, the arrangement of outside moat trenches partitions the cluster of emitters into subclusters. In some embodiments, the inside mesa trench may be fabricated in a multiple etch sequence so as to mitigate secondary oxidation that can occur during oxidation of the OA layer to form the emitter apertures, as well as other processing operations.

BRIEF DESCRIPTION OF THE DRAWINGS

FIG. 3A is a schematic cross-sectional side view illustration of an emitter including an inside mesa trench and a corresponding outside moat trench in accordance with an embodiment.

FIG. 3B is a schematic cross-sectional side view illustration of an emitter including an inside mesa trench and an overlapping outside moat trench in accordance with an embodiment.

FIGS. 7A'-7F' are schematic cross-sectional side view illustrations of a method of forming an outside moat trench and overlapping inside mesa trench of an emitter in accordance with an embodiment.

DETAILED DESCRIPTION

Figure 1A:
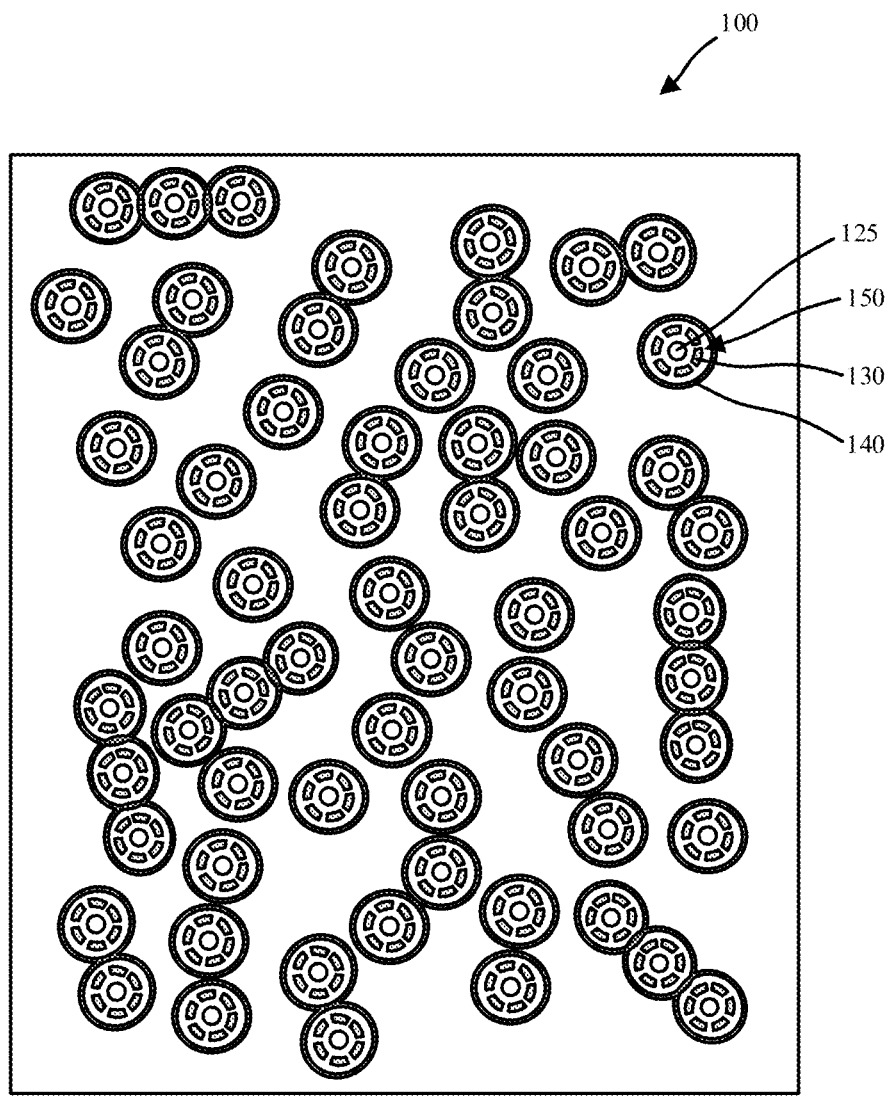
FIGS. 1A-1B are a schematic top view illustrations of emitter structures including a non-uniform distribution of emitters in accordance with embodiments.

Embodiments describe emitter structures including vertical cavity surface emitting lasers (VCSELs) and methods of manufacture. For example, the emitter structures can be a part of an infrared (IR) projector of a mobile electronic device where the VCSELs (also referred to herein as emitters) are closely arranged in dense clusters.

In one aspect, it has been observed that the oxidized portions of the oxide aperture (OA) layer for dense clusters of emitters may overlap, providing a path for moisture diffusion between emitters that can quickly propagate leading to reliability failure. In some embodiments, each emitter includes an inside mesa trench in a top DBR layer to define a top DBR layer mesa structure. The inside mesa trench may be used during fabrication to access the OA layer (e.g. oxidizable layer) extending from sidewalls of the inside mesa trench to oxidize a portion of the OA layer to form the OA for the emitter. An outside moat trench may also be formed in the top DBR layer and extend past the OA layer in order to provide a physical barrier to OA propagation. The outside moat trench configurations in accordance with embodiments may facilitate a dense arrangement of emitters, allowing emitters to be located closer together than may be possible otherwise due to propagation of moisture ingress between adjacent emitters.

In another aspect, it has been observed that secondary oxidation of aluminum-containing layers within the emitter stack-up (such as lower refractive index layers of a DBR layer) can occur during oxidation of the OA layer to form the oxide aperture. This secondary oxidation in turn may potentially not be passivated sufficiently with a trench passivation layer, and thus create additional paths for moisture diffusion and reliability failure. In some embodiments, the inside mesa trench is formed with multiple etching operations, with a first etching operation into the top DBR layer to expose the OA layer, which is then oxidized to form the OA. This may be followed by a second etching operation, followed by deposition of a passivation layer along the inside mesa trench sidewalls. Such sequences may mitigate secondary oxidation of layers adjacent the OA layer and improve reliability.

The emitter structures in accordance with embodiments may include an outside moat trench, an inside mesa trench formed with multiple etching operations, or combinations thereof.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

In the following description various configurations and fabrication sequences are described that may share similar materials, arrangements, or processes. In interests of clarity and conciseness, like features may not necessarily be described in the same detail in subsequent illustrations and processes. Accordingly, it is to be understood that a particular description with respect to a particular illustration may also be applicable to alternative configurations and illustrations that share the same or similar feature.

The terms "above", "over", "to", "between", "spanning" and "on" as used herein may refer to a relative position of one layer with respect to other layers. One layer "above", "over", "spanning" or "on" another layer or in "contact" with another layer may be directly in contact with the other layer or may have one or more intervening layers. One layer "between" layers may be directly in contact with the layers or may have one or more intervening layers.

Referring now to FIG. 1A a schematic top view illustration is provided of an emitter structure 100 including a non-uniform distribution of emitters 150 in accordance with an embodiment. As shown, each emitter 150 may include an oxide aperture (OA) 125 and an inside mesa trench 130 (which may be continuous or a pattern of non-connected inside mesa trenches). In the particular embodiment illustrated a corresponding outside moat trench 140 (which may be continuous or a pattern of non-connected outside moat trenches) is formed around each emitter 150. As shown, due to the dense arrangement, some of the outside moat trenches 140 for some of the emitters 150 may intersect one another. As will become more apparent in the following description, the outside moat trenches 140 may be designed such that the oxidized portion 123 of an OA layer 122 (see FIGS. 3A-3B) forming the oxide aperture 125 do not intersect. Thus, the outside moat trenches 140 can form a physical barrier to moisture diffusion between emitters 150 through the oxidized portions of the OA layer.

Figure 1B:
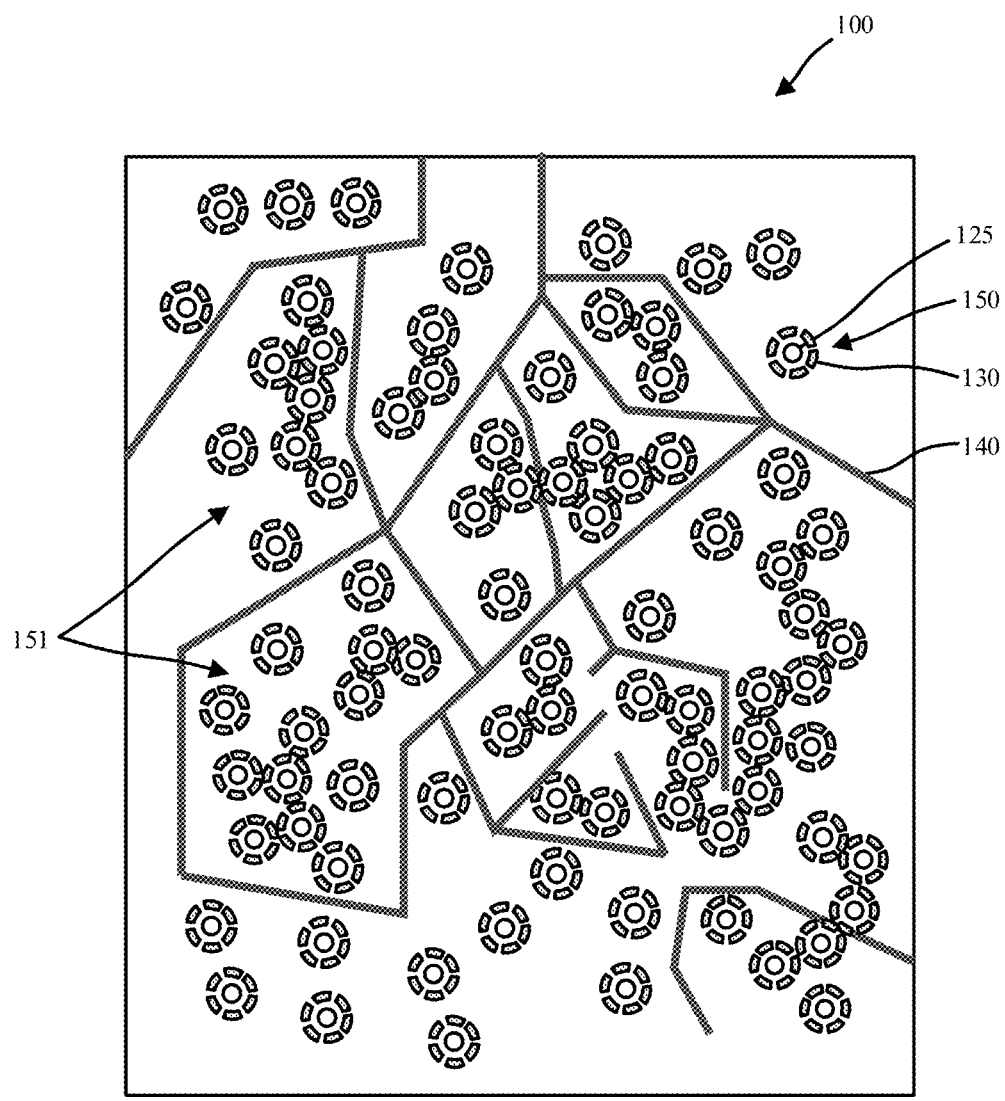

FIG. 1B a schematic top view illustration of an emitter structure 100 including a non-uniform distribution of emitters 150 similar to that of FIG. 1A, with a different arrangement of outside moat trenches 140. As shown, the outside moat trenches 140 may run laterally between pluralities of emitters. The outside moat trenches 140 may form a variety of regular and irregular shapes. In an embodiment, one or more outside moat trenches 140 can intersect one another to completely laterally surround a subcluster 151 of emitters of the emitter cluster. As shown, the emitter cluster can be partitioned into a plurality of emitter subclusters 151. In this manner, the segmented outside moat trench 140 arrangement can form moats in strategic areas. For example, subclusters 151 of very closely arranged emitters 150, or emitters with overlapping oxidized portions of their OAs can be partitioned from other emitters 150 or subclusters 151 of emitters.

It is to be appreciated that the emitter 150 clusters in accordance with embodiments may be formed in the same substrate, with each emitter 150 patterned through the same OA layer. Thus, the partitioned emitter subclusters may have a connected OA layer. The outside moat trenches 140, as well as the inside mesa trenches 130 used to oxidize the OA layer may be formed through the OA layer. Thus, in some embodiments, the inside mesa trenches 130 themselves can actually be used to protect against moisture ingress through the oxidized portions of the OA layer. In some embodiments, one or more of the outside moat trenches 140 may intersect, or overlap one or more inside mesa trenches 130.

Figure 2:
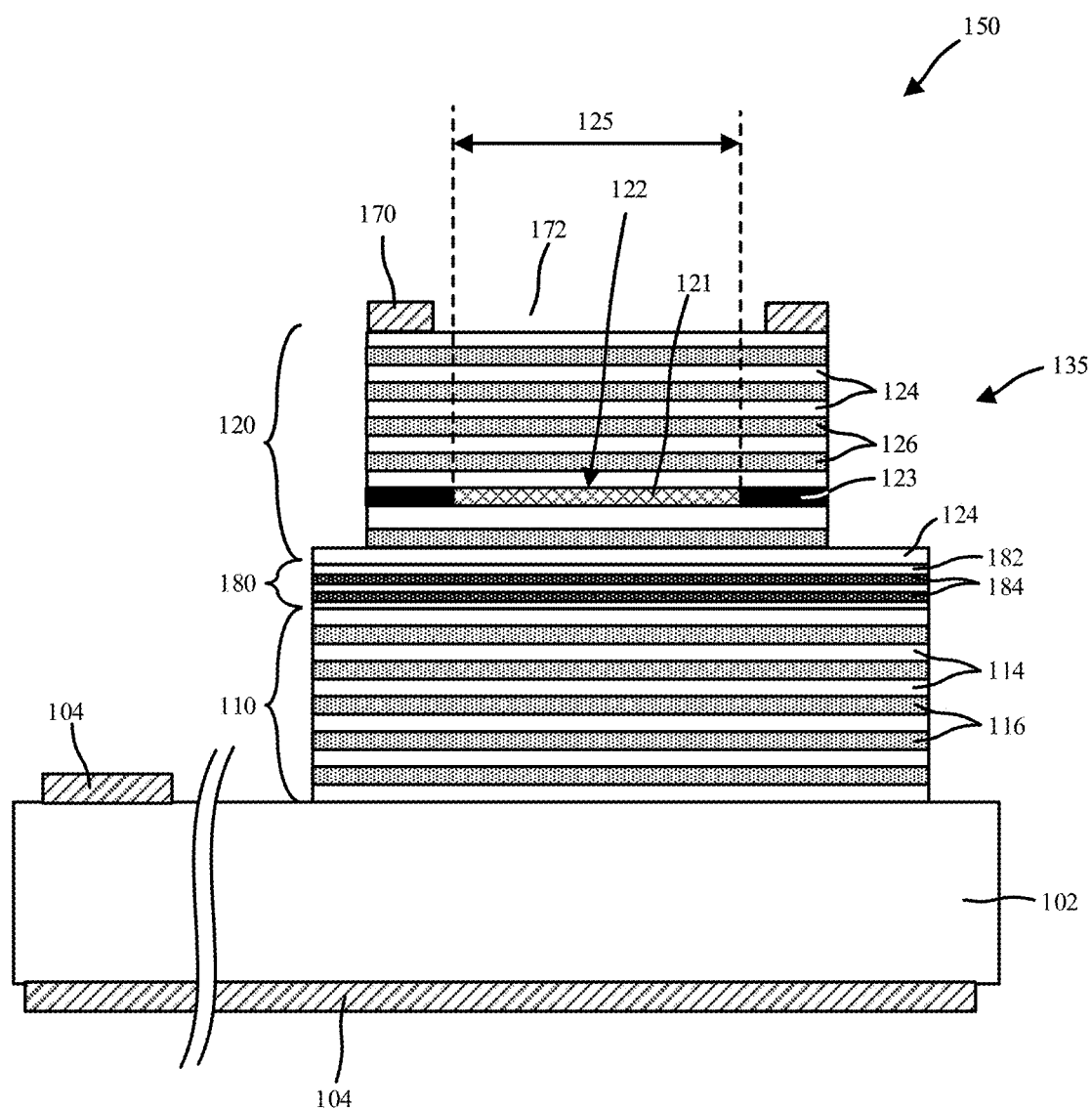
FIG. 2 is a schematic cross-sectional side view illustration of an emitter in accordance with an embodiment.

FIG. 2 is a schematic cross-sectional side view illustration of an emitter 150 in accordance with an embodiment. In particular the emitter 150 of FIG. 2 illustrates several features of a VCSEL. As shown, the emitter 150 can include a bottom distributed Bragg reflector (DBR) layer 110 formed on a growth substrate 102 (e.g. GaAs, InP or other semiconductor substrate), a top DBR layer 120 and an active layer 180 between the bottom DBR layer 110 and the top DBR layer 120. The active layer may include one or more quantum well layers 184 separated by one or more barriers layers 182. The particular wavelength emitted from the quantum well layers 184 may depend on materials selection. Exemplary quantum well materials include InGaAs, GaAs, AlGaAs, InGaAsN, GaAsSb, AlInGaP, GaInAsP, InAlGaAs, etc.

The bottom DBR layer 110 and top DBR layer 120 may include alternating layers with different indices of refraction, and may have a thickness of one quarter of the wavelength of light within each layer. Multiple alternating layer stacks can be provided to achieve requisite reflectivity. In an embodiment, the top/bottom DBR layers 120, 110 include alternating layers of GaAs and $Al_xGa_{(1-x)}As$ where the lower refractive index layers 126, 116 have a higher Al content than the higher refractive index layers 124, 114.

In accordance with embodiments the bottom DBR layer 110 and top DBR layer 120 are doped to form a p-n diode. In an embodiment, the substrate 102 and bottom DBR layer 110 are n-doped, while the top DBR layer 120 is p-doped. However, doping may be reversed. Additional junction configurations are also possible, such as n-i-p diodes or p-i-n diode structures.

In operation current flows through the emitter 150 when applying a potential across the bottom electrode 104 and top electrode layer 170. As shown, the bottom electrode 104 may be formed on either a top or back surface of the substrate 102. The top electrode layer 170 can be formed over the top DBR layer 120, and may be patterned to include an opening 172, which may be larger than the oxide aperture (OA) 125 of the emitter 150. Alternatively opening 172 may be smaller than the OA 125. In the particular embodiment illustrated, the OA 125 is formed by selectively oxidizing a portion of one or more OA layers 122, also referred to as an oxidizable layer. The OA layer(s) 122 may be one of the mirror layers within the top DBR layer 120 in an embodiment. Furthermore, selective oxidation may be achieved by tuning the composition of the OA layer 122. For example, the OA layer 122 may include a higher aluminum concentration than the surrounding layers in the top DBR layer 110. In a specific embodiment, OA layer 122 is formed of $Al_xGa_{(1-x)}As$, where x is higher than the lower refractive index layers 126, also formed of $Al_xGa_{(1-x)}As$. However, embodiments are not so limited and the OA layer 122 may be formed of other materials such as AlInAs, AlGaSb.

Oxidation of the OA layer 122 may be achieved using suitable techniques such as wet (steam) oxidation. The oxidation process may determine the distance the oxidized portion 123 encroaches inside the top DBR layer mesa structure 135. As shown, the unoxidized portion 121 of the OA layer 122 within the top DBR layer mesa structure 135 corresponds to the OA 125 of the emitter 150.

Referring now to FIG. 3A, a schematic cross-sectional side view illustration is provided of an emitter 150 in accordance with an embodiment. The cross-sectional side view illustration in FIG. 3A may be a close-up illustration of an individual emitter 150 of FIG. 1A. As shown, the emitter 150 includes the common bottom DBR layer 110 formed on the substrate 102 and top DBR layer 120 as described with regard to FIG. 2. The common bottom DBR layer 110 and substrate 102 may be shared by the plurality of emitters 150 of FIG. 1A. An active layer 180 may be located between the bottom DBR layer 110 and the top DBR layer 120. In accordance with embodiments, an inside mesa trench 130 is patterned in the top DBR layer 120 to define the top DBR layer mesa structure 135 laterally interior to the inside mesa trench 130. An OA layer 122 can also be located within the top DBR layer 120, with the OA layer including a non-oxidized portion 121 (as shown in FIG. 2) and an oxidized portion 123 that extends from one or both sidewalls 131 of the inside mesa trench 130. In the embodiment illustrated in FIG. 3A, the oxidized portion 123 may extend from both opposite sidewalls 131 of the inside mesa trench.

The oxidized portion 123 that extends into the top DBR layer mesa structure 135 may define the OA 125 for the emitter 150. In accordance with embodiments, the inside mesa trench 130 may include a bottom surface 137 located beneath the OA layer 122 and above the active layer 180. The inside mesa trench 130 in accordance with embodiments should extend through the OA layer 122 in order to expose the OA layer 122 and form the oxidized portions 123. Etching of the inside mesa trench 130 may be stopped above the active layer 180 in order to avoid forming edges along the active layer 180 that act as recombination sites. In other embodiments, the inside mesa trench can be etched through the active layer 180, for example where the emitters are driven at high current densities and/or where sidewall recombination has a negligible effect on device performance.

In the illustrated embodiment an outside moat trench 140 is also formed in the top DBR layer adjacent the inside mesa trench 130. The depth of the outside moat trench 140 may extend past the OA layer 122 in the top DBR layer 120 so as to form a physical barrier to potential moisture propagation through the OA layer 122 to adjacent emitters. The outside moat trench 140 may include a bottom surface 147 formed to a similar depth as the bottom surface 137 of the inside mesa trench 130. In accordance with embodiments, the bottom surface 147 is at least below the OA layer 122, and may extend a necessary depth past the OA layer 122 to form the physical barrier to moisture ingress. The bottom surface 147 may be located within the top DBR layer 120, or may extend into or through the active layer 180 into the bottom DBR layer 110. In an embodiment, the outside moat trench 140 is etched to a depth below that of the inside mesa trench 130, with bottom surface 147 of the outside moat trench 140 below that of the bottom surface 137 of the inside mesa trench 130.

In an embodiment the inside mesa trench 130 has width (Wi) that is narrower than a width (Wo) of the outside moat trench 140. Differential widths may be included for a variety of reasons. For example, inside mesa trench 130 width (Wi) may be reduced to facilitate a dense emitter arrangement. Additionally, the outside moat trench 140 width (Wo) may be wider to accommodate multiple passivation layers, or to mitigate resistance differences for the top electrode layer 170. A variety of configurations are possible, including same widths, or an inside mesa trench 130 with a width (Wi) that is wider than a corresponding outside moat trench 140 width (Wo).

Still referring to FIG. 3A, a passivation layer 160 may be formed over the top DBR layer 120 and within the outside moat trench 140 and within the inside mesa trench 130. The passivation layer 160 can also be formed over the top DBR layer mesa structure 135. Openings 169 can be formed within the passivation layer for deposition of a top electrode layer 170 to make electrical contact with the top DBR layer mesa structure 135. An opening 172 may be formed in the top electrode layer 170 to allow light emission from the emitter 150. For example, opening 172 may be larger (e.g. width, diameter, etc.) than OA 125 so as to not further constrict the device aperture, however this is not necessary and the opening 172 may be the same or smaller than OA

125. In some embodiments the passivation layer 160 is thicker within the outside moat trench 140 than within the inside mesa trench 130. Specifically, thickness (Ti) within the inside mesa trench 130 may be less than thickness (To) within the outside moat trench 140. For example, these thicknesses may correspond to thicknesses on the bottom surface or sidewalls of the respective trenches. As will be described in more detail with regard to FIGS. 6-7F' this may be attributed to a multi-layer passivation layer 160, including a lower passivation layer and an upper passivation layer on top of the lower passivation layer, where the lower passivation layer spans within the outside moat trench 140, and the upper passivation layer spans within both the inside mesa trench 130 and within the outside moat trench 140. In other embodiments, passivation layer 160 has a same thickness within the outside moat trench 140 and the inside mesa trench 130. For example, the lower passivation layer may be a temporary layer used for patterning that is removed prior to formation of the upper passivation layer.

The distance (d) between the outside moat trench 140 and inside mesa trench 130 can be a minimum dimension, which may facilitate a dense arrangement of emitters. In the particular arrangement illustrated in FIG. 3A, the oxidized portion 123 of the OA layer 122 encroaches toward, but does not reach sidewalls 141 of the outside moat trench 140. In some embodiments, the oxidized portion 123 may laterally extend to and intersect the sidewalls 141 of the outside moat trench 140. In the embodiment illustrated in FIG. 3B, the outside moat trench 140 overlaps or intersects the inside mesa trench 130 such that the oxidized portion 123 of the OA layer 122 only encroaches from a single sidewall 141 into the top DBR layer mesa structure 135.

The pattern of outside moat trenches 140 in accordance with embodiments may be determined based on the arrangement of dense emitters 150. In some embodiments a corresponding outside moat trench 140 can be formed partially or completely around the inside mesa trench 130 for each emitter 150, as illustrated in FIG. 1A. The outside moat trenches 140 can also be formed adjacent multiple emitters 150, as illustrated in FIG. 1B. Furthermore, in both configurations, the outside moat trenches 140 may be spaced apart from the inside mesa trenches 130 by a distance (d), or may overlap or otherwise intersect the inside mesa trenches 130.

Figure 4B:
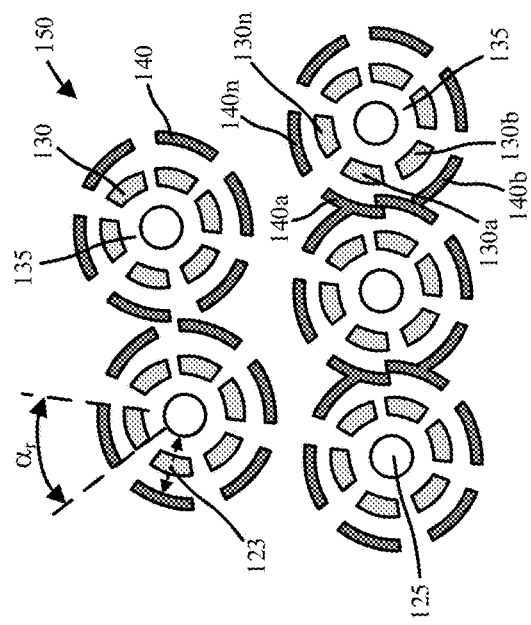
FIG. 4B is a schematic top-down view illustration of an emitter in which a corresponding outside moat trench is a pattern of non-connected outside moat trenches in accordance with an embodiment.
Figure 4A:
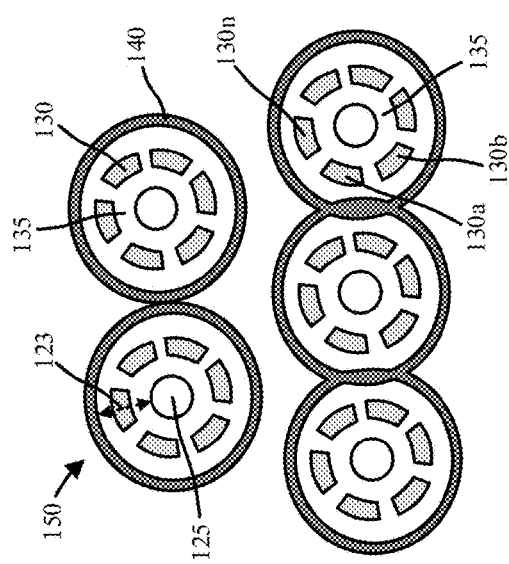
FIG. 4A is a schematic top view illustration of a dense arrangement of emitters and intersected outside moat trenches in accordance with an embodiment.

Referring now to FIG. 4A-4B, a schematic top view illustration is provided in FIG. 4A of a dense arrangement of emitters 150 and one or more intersected outside moat trenches. 140. In the particular embodiment illustrated each respective outside moat trench 140 completely surrounds a respective set of inside mesa trenches 130 and the top DBR layer mesa structure 135 for each respective emitter 150. However, this is not required, and intersected outside moat trenches 140 can form a variety of configurations as shown in FIGS. 1A-1B. In the embodiment illustrated in FIG. 4B the outside moat trenches 140 may each be a pattern of non-connected outside moat trenches 140a, 140b . . . 140n. In such a configuration, the oxidized portions 123 of the OA layer 122 may possibly extend between the outside moat trenches 140. The pattern of the non-connected outside moat trenches in accordance with embodiments, may nevertheless mitigate the propagation of moisture ingress between adjacent emitters. Similarly, the inside mesa trench 130 can be a pattern of non-connected inside mesa trenches 130a, 130b . . . 130n. In the embodiment illustrated in FIG. 4B, the pattern of non-connected outside moat trenches 140 (140a, 140b . . . 140n) is aligned with the pattern of non-connected inside mesa trenches 130 (130a, 130b . . . 130n). In an embodiment, the pattern of non-connected outside moat trenches covers a same or larger radial angle ($\alpha_r$) from a center of the top DBR layer mesa structure than does the pattern of non-connected inside mesa trenches. Alternatively, the inside mesa trench 130 can completely surround the corresponding top DBR layer mesa structure 135 for a corresponding mesa structure (similarly as the outside moat trenches are illustrated in FIG. 4A).

Figure 4D:
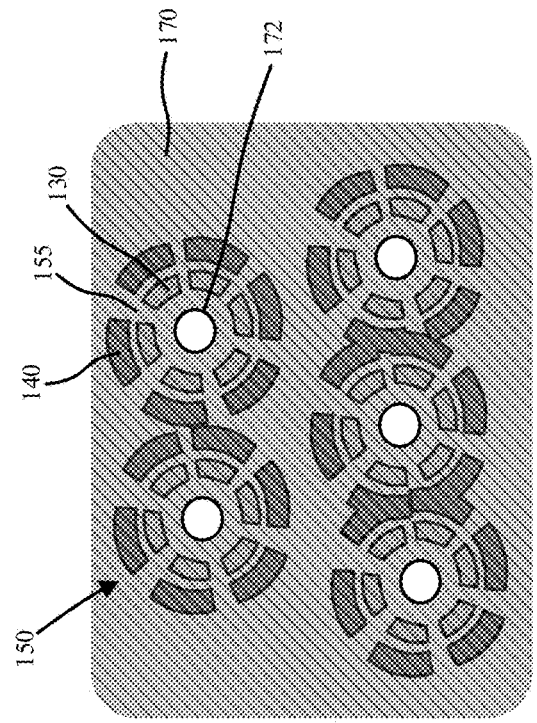
FIG. 4D is a schematic top view illustration of a top electrode layer formed over a dense arrangement of emitters in which a corresponding outside moat trench is a pattern of non-connected outside moat trenches around the inside mesa trench and the top DBR mesa structure for each emitter in accordance with an embodiment.
Figure 4C:
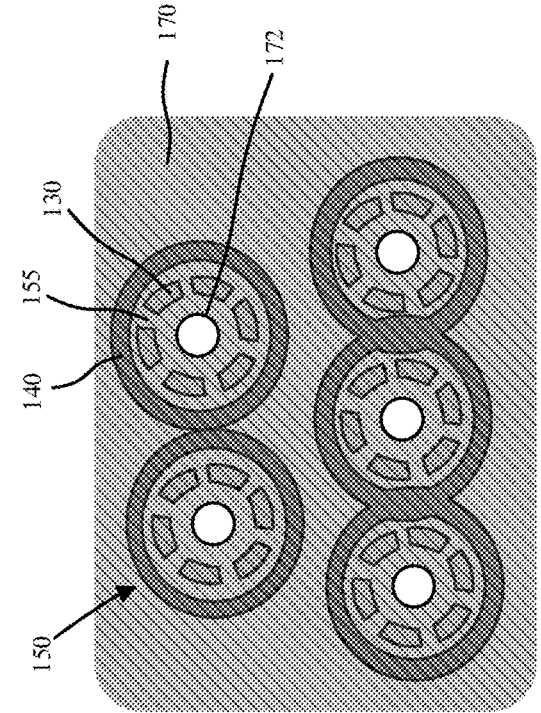
FIG. 4C is a schematic top-down view illustration of a top electrode layer formed over a dense arrangement of emitters in which a corresponding outside moat trench completely surrounds the inside mesa trench and the top DBR mesa structure for each emitter in accordance with an embodiment.

Referring to FIG. 4C-4D top-down view illustrations are provided after formation of the top electrode layer 170 over the dense arrangement of emitters of FIGS. 4A-4B in accordance with embodiments. As shown, the top electrode layer 170 may be shared for each of the emitters 150. For example, top electrode layer 170 may be a metal layer (e.g. gold) formed using a suitable technique such as plating, sputtering or evaporation. Referring also to FIGS. 3A-3B, it is shown that step coverage of the top electrode layer 170 can be affected by the inside mesa trench 130 width (Wi) and outside moat trench 140 width (Wo), leading to variations in thickness of the top electrode layer 170, which in turn can affect sheet resistance of the top electrode layer 170 and operation characteristics of the emitter structure 100. In accordance with embodiments, tie bars 155 of the top DBR layer 120 may extend laterally between the non-connected inside mesa trenches 130 (130a, 130b . . . 130n) and/or non-connected outside moat trenches 140 (140a, 140b . . . 140n) when present. Such an arrangement may allow for a uniform thickness of top electrode layer 170 to be formed over each emitter 150, which can provide a uniform current path of lowest resistance. In some embodiments, the inside mesa trench 130 width (Wi) is less than the outside moat trench 140 width (Wo), and hence the inside mesa trench 130 may be characterized by a higher aspect ratio when depths are similar. In some embodiments, a wider outside moat trench 140 width (Wo) may facilitate a more uniform trench filling ability of the top electrode layer 170, and more uniform resistance across the dense arrangement of emitters 150.

Figure 5:
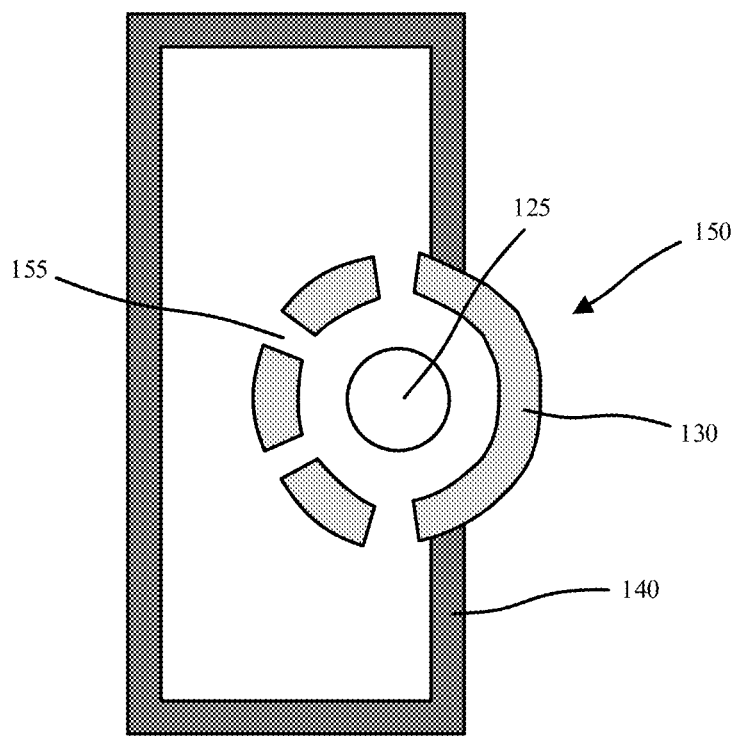
FIG. 5 is a schematic top view illustration of an emitter with an inside mesa trench overlapping an outside moat trench in accordance with an embodiment.

FIG. 5 is a schematic top view illustration of an emitter with an inside mesa trench overlapping an outside moat trench in accordance with an embodiment. In particular, FIG. 5 illustrates a combination of various possible structures. As shown, an outside moat trench 140 may overlap with an inside mesa trench 130 for an emitter 150. This outside moat trench 140 may be associated with one or more corresponding emitters 150. The inside mesa trench 130 is also shown combining features of FIGS. 4A-4B with both a continuous region and a region of non-connected inside mesa trenches. Notably, the OA 125 of the emitter 150 illustrated in FIG. 5 is protected against the ingress of moisture, with the outside moat trench 140 protecting one side, and the continuous inside mesa trench 130 protecting the other side. As such a continuous combined trench is formed that can act as a barrier to moisture propagation through the oxidized portion of the OA layer. Furthermore, similar to the discussion of FIGS. 4C-4D, the non-connected inside mesa trenches and tie bars 155 can provide a structure for better step coverage of the top electrode layer, and lower sheet resistance. It is to be appreciated that the structure of FIG. 5 is shown as an exemplary embodiment for overlapping inside mesa trenches 130 and outside moat trenches 140, and such configurations can be integrated with both embodiments illustrated in FIGS. 1A-1B and 3A-3B since various different combinations of inside mesa trenches 130 and outside moat trenches 140 are possible in a dense emitter 150 arrangement.

Figure 6:
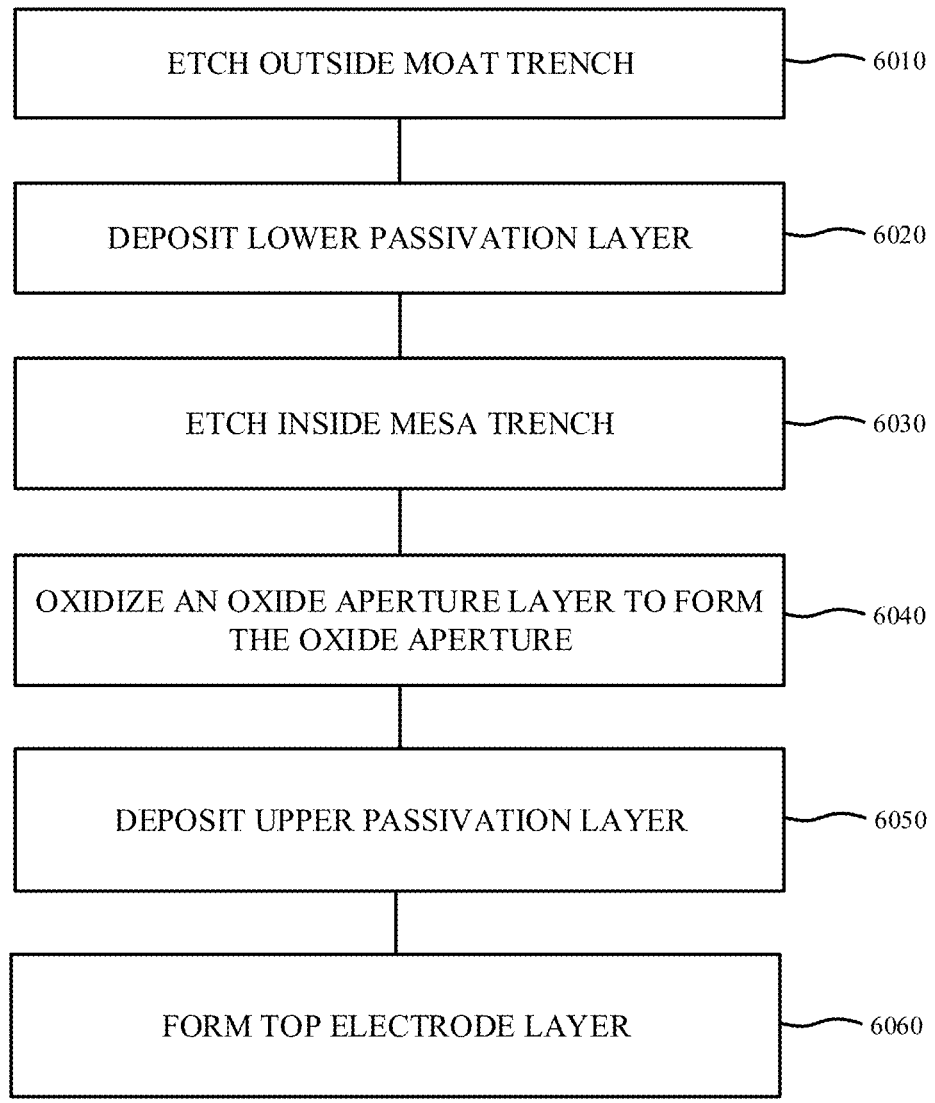
FIG. 6 is a flow diagram for a method of forming an outside moat trench adjacent an inside mesa trench of an emitter in accordance with an embodiment.
Figure 7A:
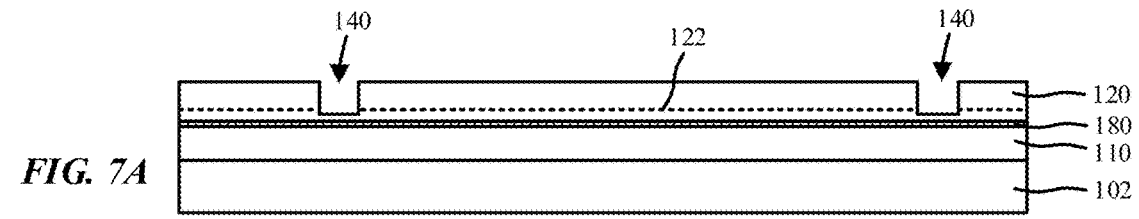
FIGS. 7A-7F are schematic cross-sectional side view illustrations of a method of forming an outside moat trench adjacent inside mesa trench of an emitter in accordance with an embodiment.

FIG. 6 is a flow diagram for a method of forming an emitter with an outside moat trench and inside mesa trench in accordance with an embodiment. FIGS. 7A-7F are schematic cross-sectional side view illustrations of a method of forming an outside moat trench adjacent an inside mesa trench of an emitter in accordance with an embodiment. FIGS. 7A'-7F' are schematic cross-sectional side view illustrations of a method of forming an outside moat trench and overlapping inside mesa trench of an emitter in accordance with an embodiment. In interest of clarity and conciseness, the structures and process flow of FIG. 6, FIGS. 7A-7F and FIGS. 7A'-7F' are described together in the following description.

The processing sequence may begin with a semiconductor structure including substrate 102 (e.g. n-doped GaAs), bottom DBR layer 110 (e.g. n-doped), top DBR layer 120 (e.g. 9-doped), and a multiple quantum well (MWQ) active layer in between. As shown in FIGS. 7A and 7A', at operation 6010 the outside moat trenches 140 are etched into the top DBR layer 120 for the arrangement of emitters 150 in the emitter structure. As previously described, the outside moat trenches 140 are etched to a depth past the OA layer 122. As illustrated, the etching of outside moat trenches 140 may terminate in the top DBR layer 120. Alternatively, the outside moat trenches 140 may extend to, or into, the bottom DBR layer 110.

Figure 7B:
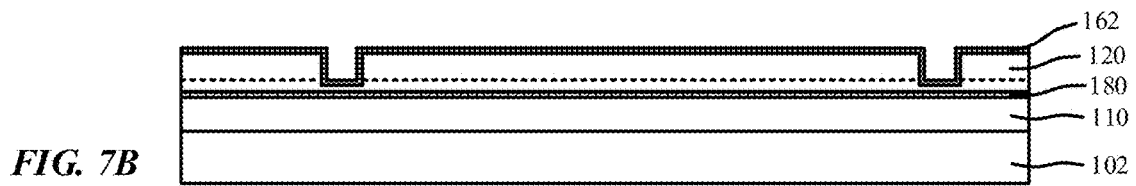

As shown in FIGS. 7B and 7B', at operation 6020 a lower passivation layer 162 may then be deposited over the patterned top DBR layer 120 and within the outside moat trenches 140. The lower passivation layer 162 may be formed of a variety of materials that are resistant to oxidation, including, but not limited to, nitride materials such as silicon nitride ($Si_xN_y$). The lower passivation layer 162 may protect the OA layer 122 during a subsequent wet oxidation operation, and can additionally be used to define alignment marks for the structure.

Figure 7C:
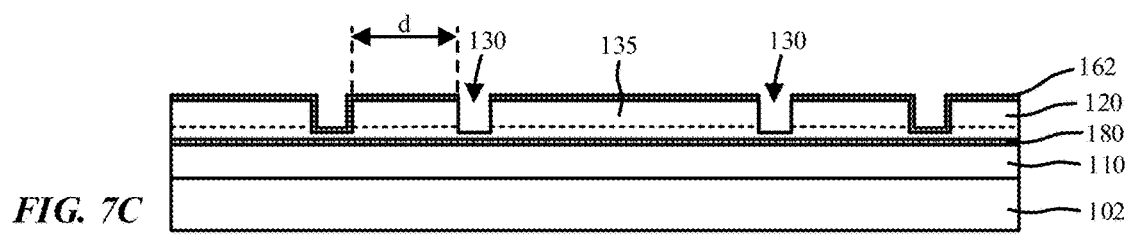

The inside mesa trenches 130 can then be etched at operation 6030, as shown in FIGS. 7C and 7C'. As previously described, the inside mesa trenches 130 are etched through the lower passivation layer 162 and top DBR layer 120 to a depth past the OA layer 122. As illustrated, the etching of inside mesa trenches 130 may be controlled to terminate in the top DBR layer 120. The etching may be single operation, or include multiple etching operations in accordance with embodiments. In the embodiment illustrated in FIG. 7C, the inside mesa trench 130 may be separated from the outside moat trench 140 by a distance (d). In the embodiment illustrated in FIG. 7D, the inside mesa trench 130 may overlap or intersect the outside moat trench 140.

Figure 7D:
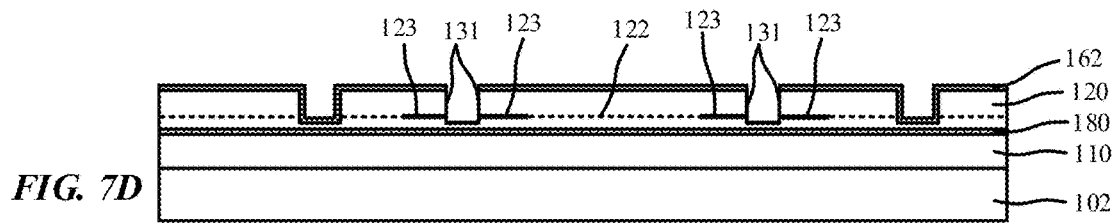

Referring now to FIGS. 7D and 7D', at operation 6040 the OA layer 122 exposed within inside mesa trenches 130 is oxidized to create the OA 125 from the oxidized portions 123 within the top DBR layer mesa structures 135. For example, a wet oxidation (e.g. steam) technique may be utilized, with the amount of encroachment of the oxidized portions 123 into the top DBR layer mesa structures 135 determining the size of the OA 125. In the embodiment illustrated in FIG. 7D, oxidized portions 123 grow from both opposite sidewalls 131 of the inside mesa trenches 130. In the embodiment illustrated in FIG. 7D' the oxidized portions extend from a single sidewall 131, while sidewalls 141 of the combined trench are covered by lower passivation layer 162 which acts as a barrier to oxidation of the OA layer 122 in that direction. Where multiple etching operations are used to form the inside mesa trenches 130 a subsequent etching operation may be performed after operation 6040 to complete the inside mesa trenches 130.

Figure 7E:
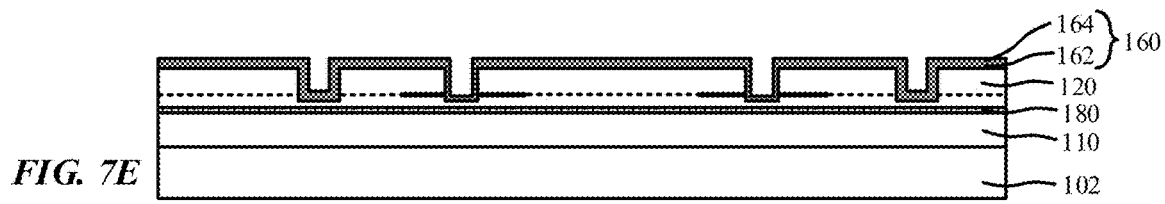

An upper passivation layer 164 may then be deposited at operation 6050, as shown in FIGS. 7E and 7E'. Together the lower passivation layer 162 and upper passivation layer 164 may form a multi-layer passivation layer 160. The upper passivation layer 164 may also be formed of the same material as lower passivation layer 162. As shown, the passivation layer 160 spans over the top DBR layer mesa structure 135, within the inside mesa trench 130 and within the outside moat trench 140. This may be a continuous layer across all emitters 150 in the emitter structure 100. In an embodiment the passivation layer 160 is thicker within the outside moat trench 140 than within the inside mesa trench 130. This may be attributed to the two-layer fabrication sequence, with the lower passivation layer 162 spanning within the outside moat trench 140, and the upper passivation layer 164 spanning within both the inside mesa trench 130 and within the outside moat trench 140. Alternatively, the lower passivation layer 162 can be removed prior to depositing the upper passivation layer 164, forming a single-layer passivation layer 160.

Figure 7F:
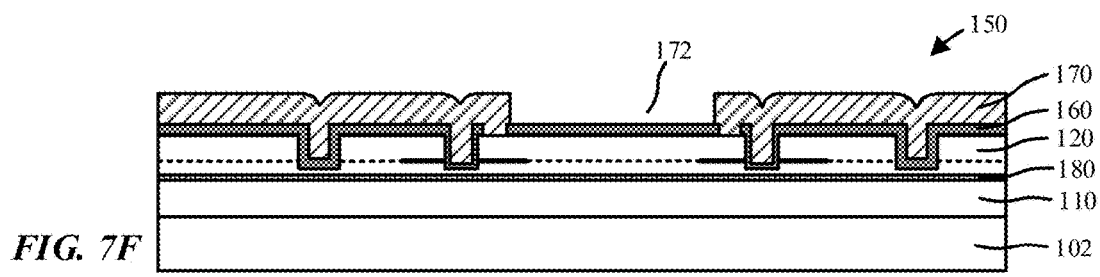
Figure 7A:
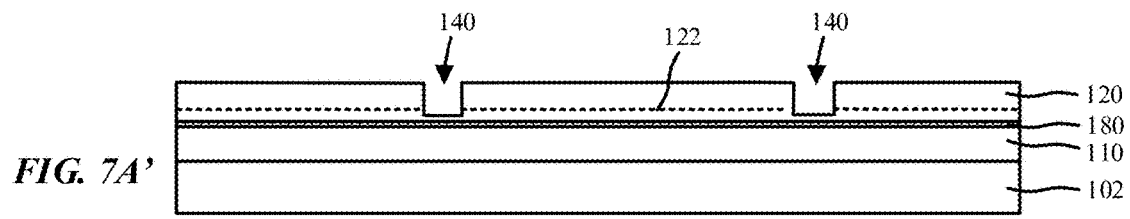
Figure 7B:
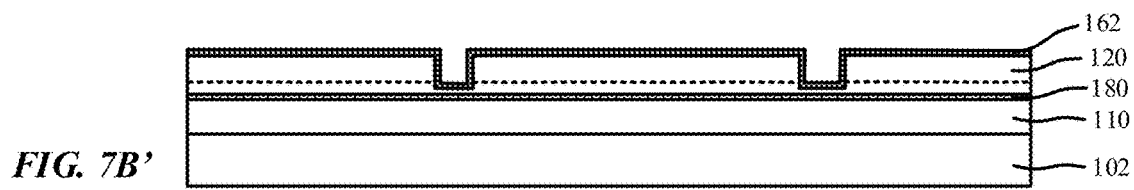
Figure 7C:
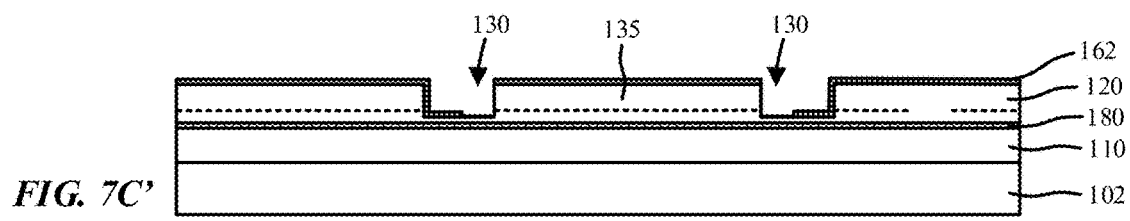
Figure 7D:
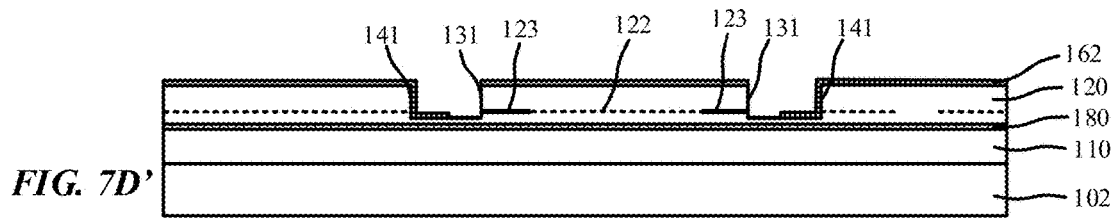
Figure 7E:
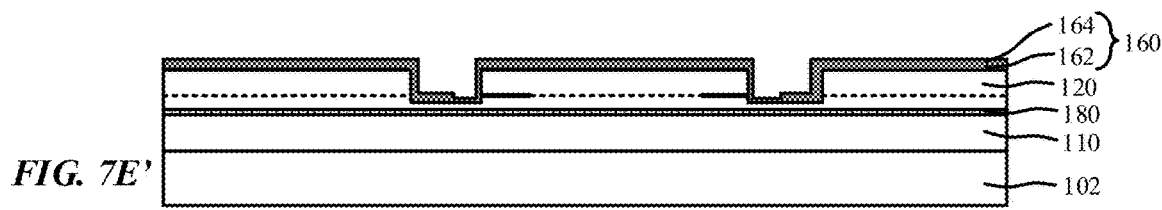
Figure 7F:
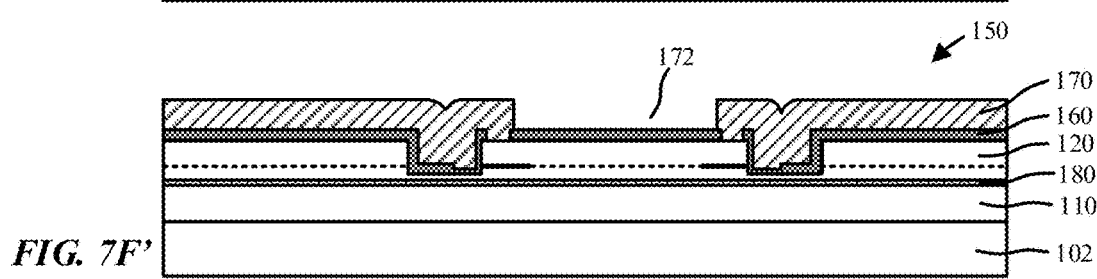

The top electrode layer 170 may then be formed at operation 6060 using a suitable technique such as plating or evaporation. In an embodiment the top electrode layer 170 is formed of gold, though other suitable electrically conductive materials may be used. As shown in FIGS. 7F-7F', the top electrode layer 170 may be patterned, or selectively grown or deposited, to form openings 172 over the top DBR layer mesa structures 135 for each emitter 150.

The inside mesa trench 130 may be formed using single or multiple step etching operations. Furthermore, the multiple step etching operations can include the OA layer oxidation operation as an intermediate operation between etching operations.

Figure 8C:
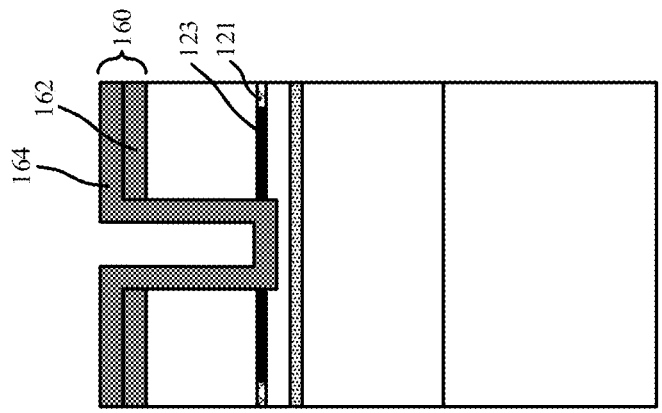
FIGS. 8A-8C are schematic cross-sectional side view illustrations of a method of forming and passivating an inside mesa trench in accordance with an embodiment.
Figure 8B:
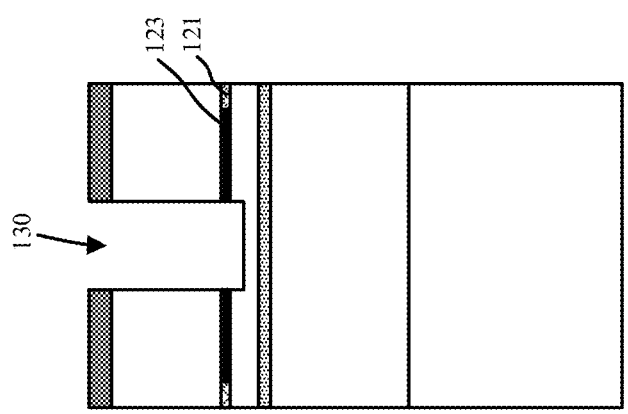
Figure 8A:
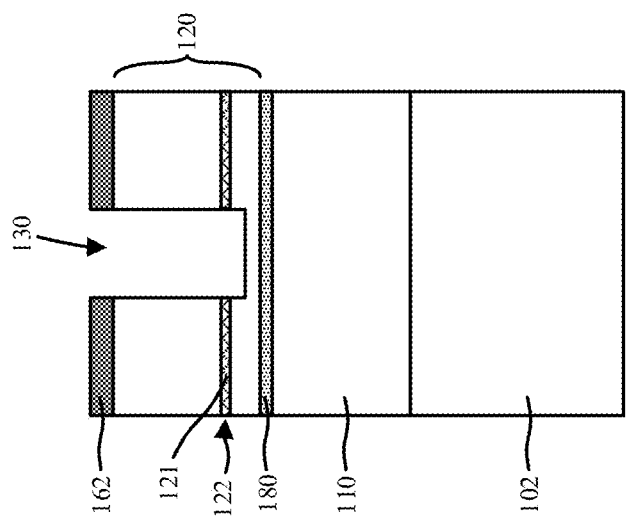
Figure 8D:
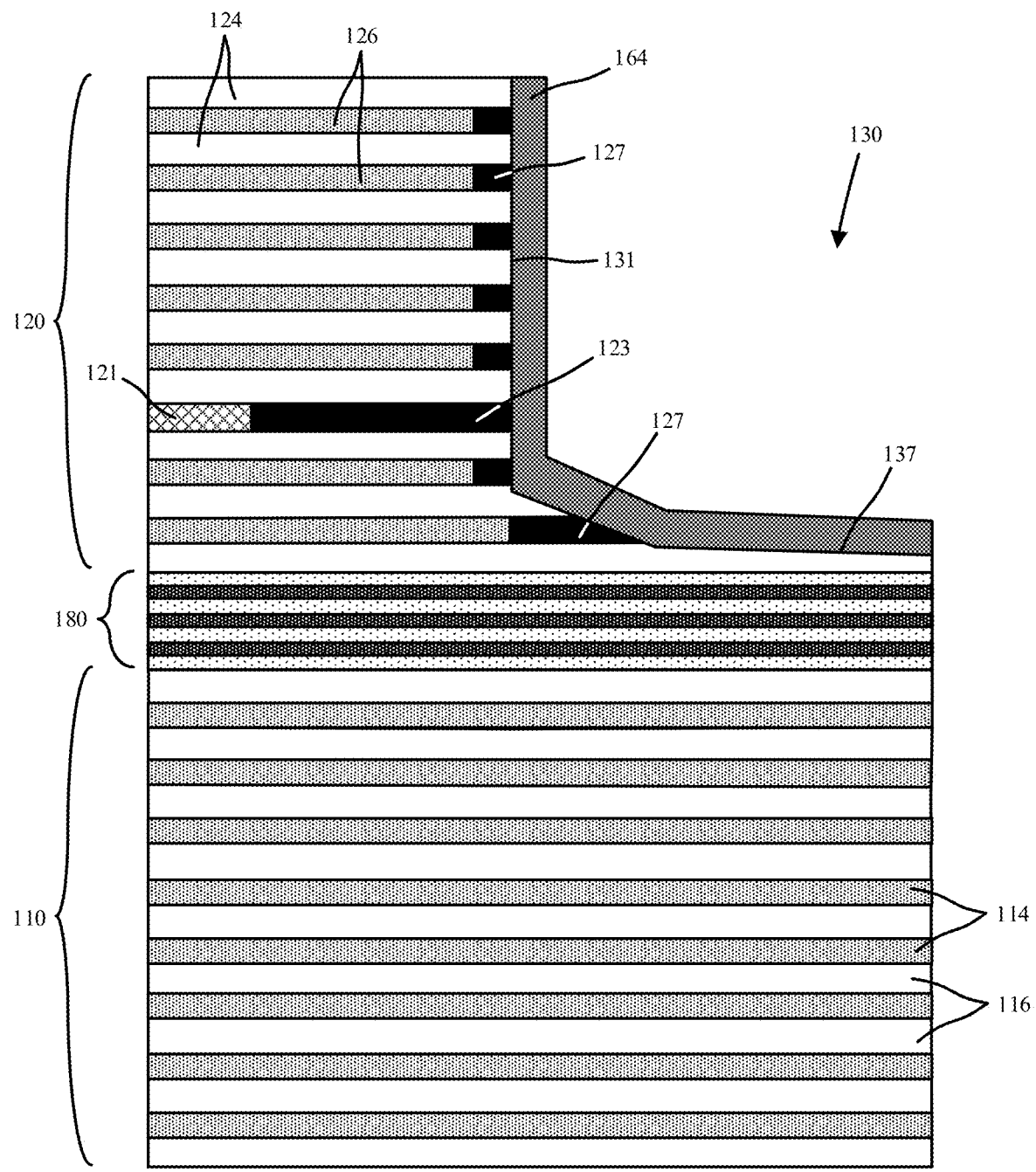
FIG. 8D is a close-up schematic cross-sectional side view illustration of the inside mesa trench of FIG. 8C in accordance with an embodiment.

FIGS. 8A-8C are schematic cross-sectional side view illustrations of a method of forming and passivating an inside mesa trench 130 in accordance with an embodiment. Specifically, the inside mesa trench 130 may be completely formed prior to oxidation of the OA layer 122. FIG. 8D is a close-up schematic cross-sectional side view illustration of the inside mesa trench of FIG. 8C in accordance with an embodiment. Referring to FIG. 8A, the inside mesa trench 130 is etched similarly as previously described with regard to operation 6030 and FIGS. 7C and 7C'. FIG. 8B is an illustration after oxidizing the OA layer 122 as previously described with regard to operation 6040 and FIGS. 7D and 7D'. FIG. 8C is an illustration after depositing the upper passivation layer 164 on the lower passivation layer 162 and within the inside mesa trench 130 as previously described with regard to operation 6050 and FIGS. 7E and 7E'. Alternatively, the lower passivation layer 162 can be removed prior to depositing the upper passivation layer 164.

Referring now to FIG. 8D, the resulting emitter can include secondary oxidation regions 127 within the lower refractive index layers 126 (e.g. aluminum-containing) of the top DBR layer 120. In such an embodiment, any surrounding DBR layers that are oxidizable (e.g. due to aluminum) may be partly oxidized during the oxidation operation of the OA layer 122. Thus, formation of the oxidized portions 123 of the OA layer 122 to form the oxide aperture may result in secondary oxidation of exposed DBR layers, though to a lesser extent since aluminum concentration may be lower compared to the OA layer 122.

In an embodiment, the top DBR layer 120 includes alternating aluminum-containing layers (e.g. 126) and non-aluminum-containing layers (e.g. 124), including a closest aluminum-containing layer above the OA layer 122 and a closest aluminum-containing layer below the OA layer, where the closest aluminum-containing layer above the OA layer and along the opposite sidewalls 131 of the inside mesa trench 130 and the closest aluminum-containing layer below the OA layer and along the opposite sidewalls 131 of the inside mesa trench are both oxidized (i.e. secondary oxidation) where the secondary oxidation regions 127 encroach inside the top DBR layer mesa structure 135. As shown the bottom surface 137 of the inside mesa trench 130 is located within the top DBR layer 120. In an embodiment, etching of the inside mesa trenches 130 is controlled to form the bottom surface 137 on a non-aluminum-containing higher refractive index layer 124 so as to reduce secondary oxidation effects on the bottom surface, and confine potential secondary oxidation to the sidewalls 131.

In accordance with embodiments, it has been observed that secondary oxidation of aluminum-containing layers within the emitter stack-up can provide additional avenues for moisture ingress. In particular, adhesion of the passivation layer 160 (i.e. upper passivation layer 164) with oxidized materials may be lower than with the non-oxidized materials within the DBR layers, potentially providing additional avenues for moisture ingress. It is noted that if the inside mesa trenches 130 were etched deeper into the bottom DBR layer 110, the lower refractive index layers (e.g. aluminum containing) of the bottom DBR layer 110 could likewise be oxidized during OA oxidation to form similar secondary oxidation regions.

Figure 9C:
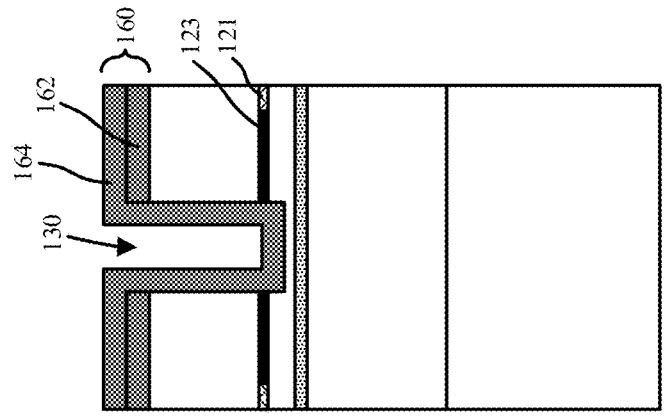
FIGS. 9A-9C are schematic cross-sectional side view illustrations of a method of forming and passivating an inside mesa trench with two etching operations in accordance with an embodiment.
Figure 9B:
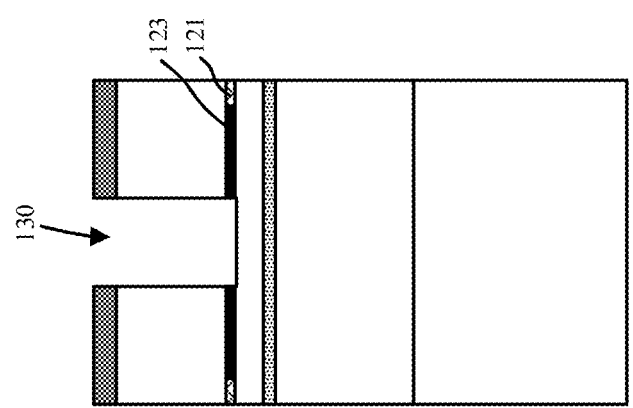
Figure 9A:
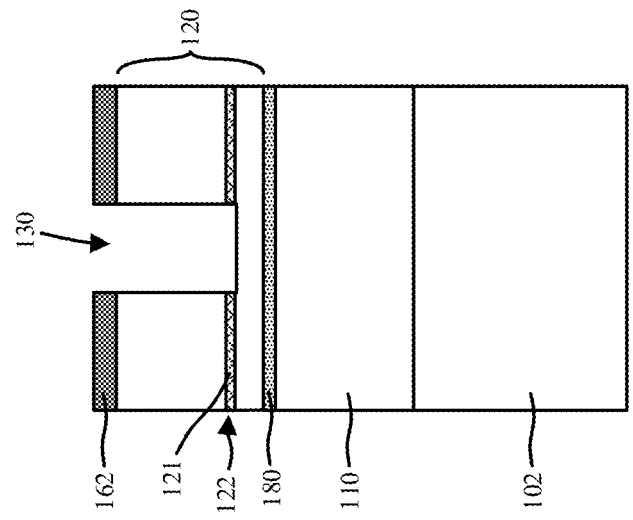
Figure 9D:
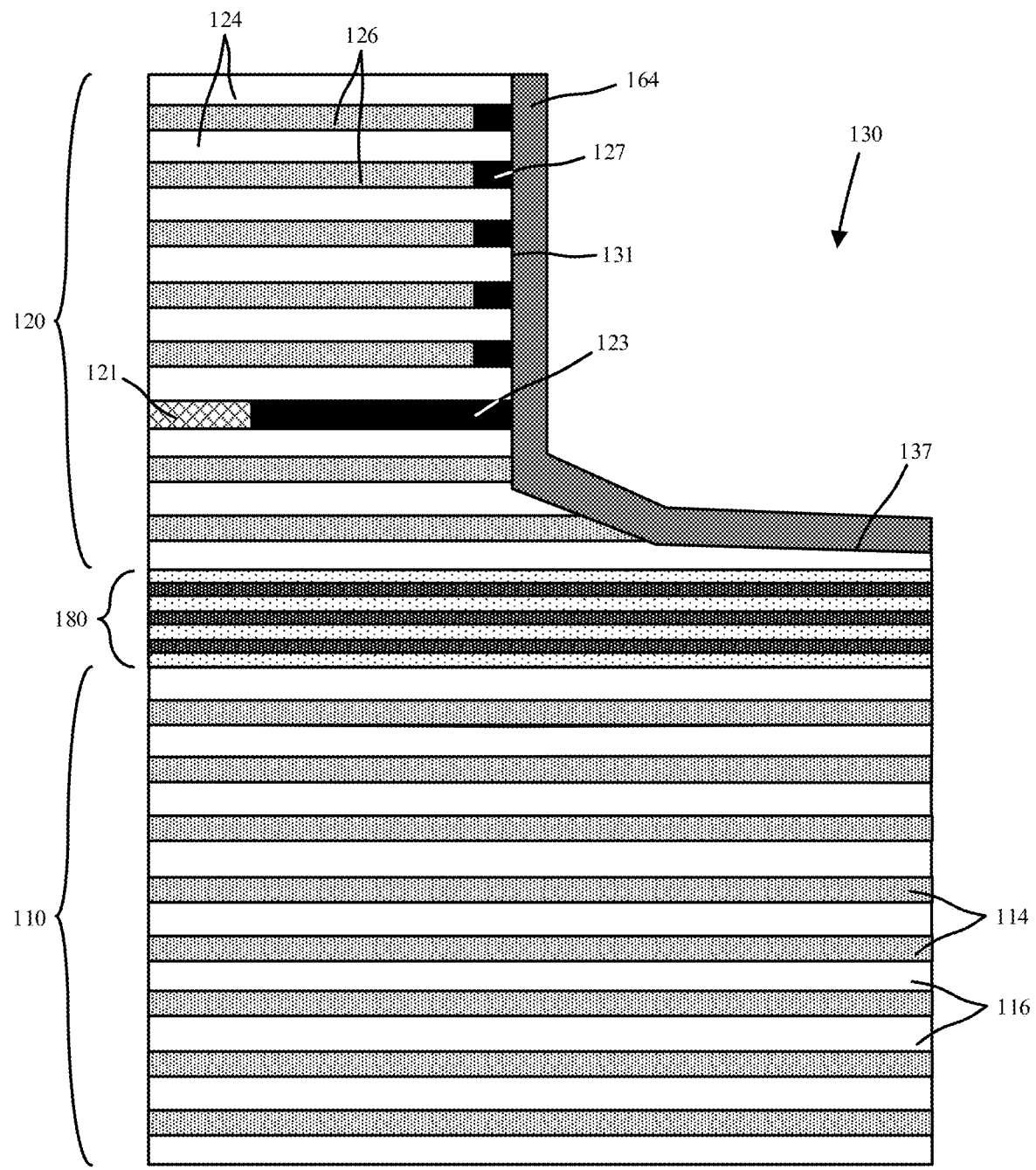
FIG. 9D is a close-up schematic cross-sectional side view illustration of the inside mesa trench of FIG. 9C in accordance with an embodiment.

FIGS. 9A-9C are schematic cross-sectional side view illustrations of a method of forming and passivating an inside mesa trench 130 with two etching operations in accordance with an embodiment. Specifically, oxidation of the OA layer 122 may be an intermediate operation between two separate trench etching operations. FIG. 9D is a close-up schematic cross-sectional side view illustration of the inside mesa trench of FIG. 9C in accordance with an embodiment.

Referring to FIG. 9A, the inside mesa trench 130 is partially etched, stopping after etching through the OA layer 122. For example, this may be a dry etching technique sensitive to aluminum content, such as dry $BCl_3$ etchant. In an embodiment, etching may terminate on the first non-aluminum-containing higher refractive index layer 124 immediately below the OA layer 122. The oxidation operation (e.g. wet oxidation) may then be performed as shown in FIG. 9B to for the oxidized portions 123 of the OA layer 122. Following oxidation, a second etching operation can be performed to complete the inside mesa trench 130. The second etching operation can be either a wet or dry (e.g. $BCl_3$) etching technique, and may stop within the top DBR layer 120. For example, the bottom surface 137 may be located on a non-aluminum-containing higher refractive index layer 124. However, this is not required with the multiple etching sequence, and a less selective etching technique may be used. Thus, the bottom surface 137 can also or alternatively expose the more oxidation prone lower refractive index layers 126 (e.g. aluminum-containing) since the OA layer 122 oxidation has already been performed.

In an embodiment, the second trench etching operation is self-aligned with the first trench etching operation. The lower passivation layer 162 can be used as a mask, or alternatively, photoresist or another hard mask material can be used as a mask, and be subsequently removed. The upper passivation layer 164 may then be deposited over the lower passivation layer 162 and within the inside mesa trench 130 as shown in FIG. 9C. Alternatively, the lower passivation layer 162 can be removed prior to depositing the upper passivation layer 164.

Referring now to FIG. 9D, the resulting emitter structure can include secondary oxidation regions 127 within the lower refractive index layers 126 (e.g. aluminum-containing) of the top DBR layer 120 that were exposed after the first trench etching operation (i.e. those layers above the OA layer 122). As shown, aluminum-containing layers below the OA layer 122 are protected against secondary oxidation during the oxidation operation of the OA layer 122. This may remove avenues for moisture ingress and improve adhesion of the passivation layer 160 (i.e. upper passivation layer 164).

In an embodiment, the top DBR layer 110 includes alternating aluminum-containing layers (e.g. 126) and non-aluminum-containing layers (e.g. 124), including a closest aluminum-containing layer above the OA layer 122 and a closest aluminum-containing layer below the OA layer, where the closest aluminum-containing layer above the OA layer and along the opposite sidewalls 131 of the inside mesa trench 130 is oxidized more (e.g. oxide encroachment is further) than the closest aluminum-containing layer below the OA layer and along the opposite sidewalls of the inside mesa trench.

Figure 10C:
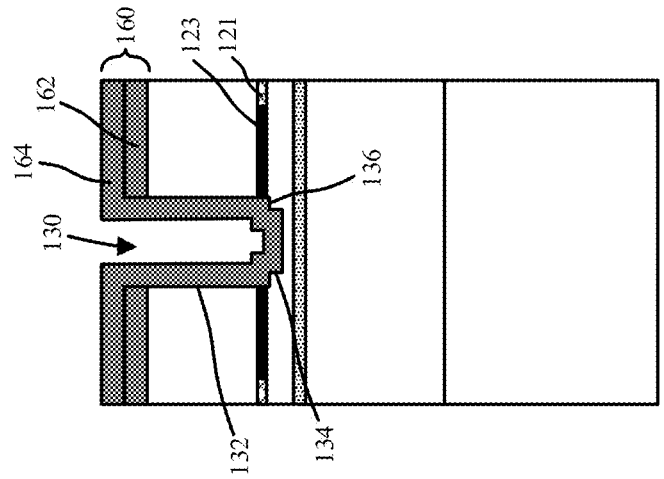
FIGS. 10A-10C are schematic cross-sectional side view illustrations of a method of forming and passivating an inside mesa trench with two etching operations in accordance with an embodiment.
Figure 10B:
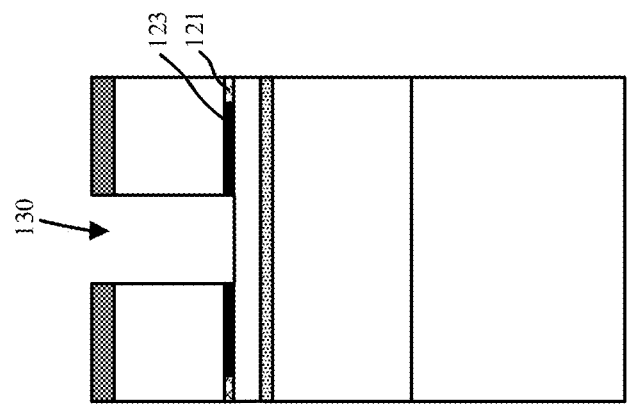
Figure 10A:
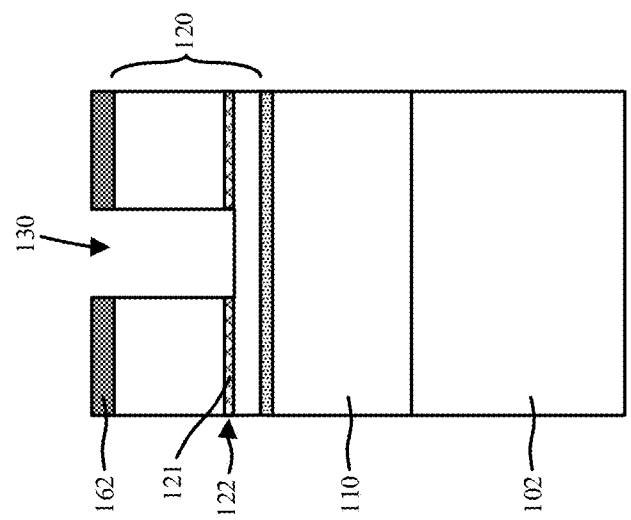
Figure 10D:
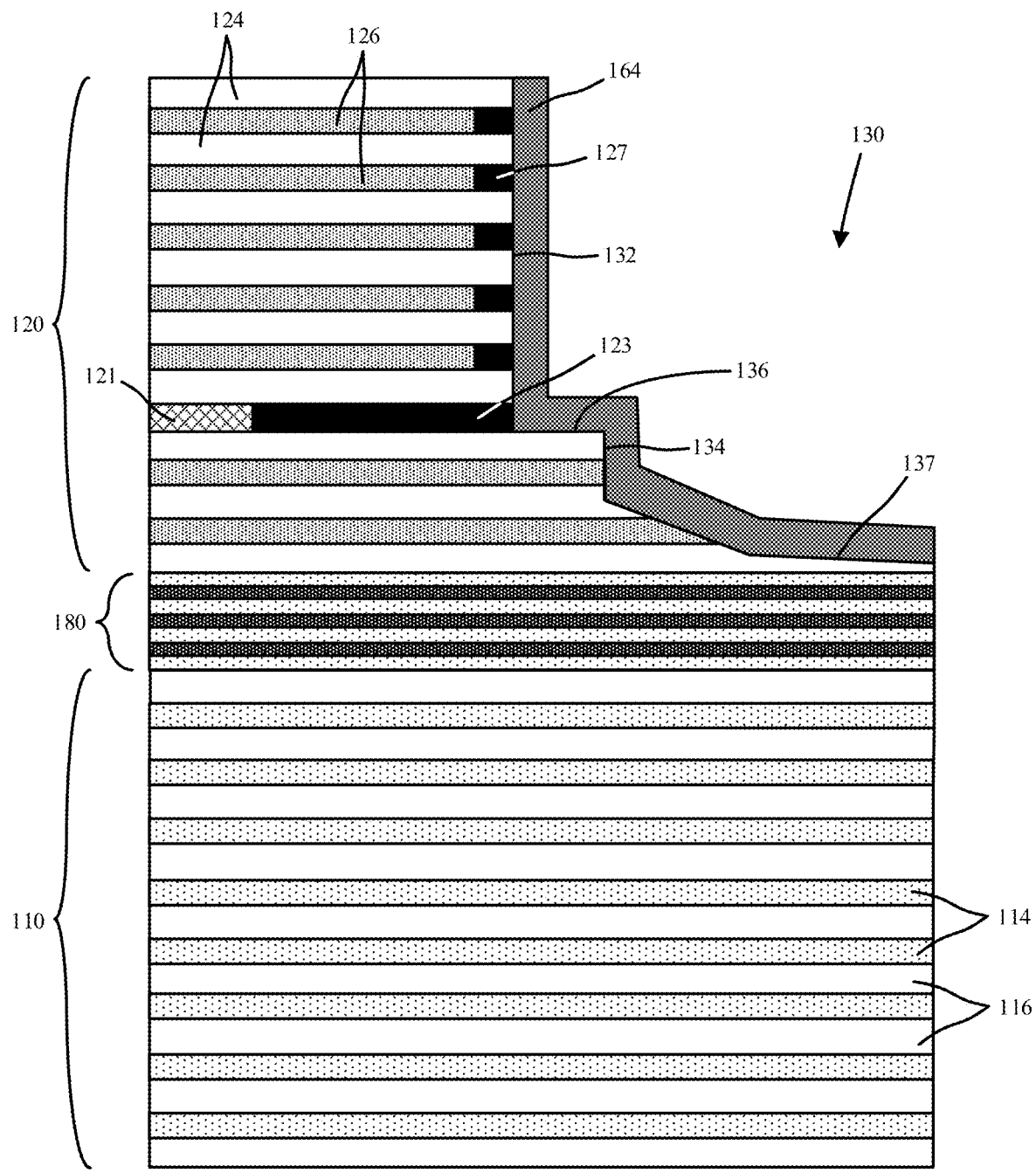
FIG. 10D is a close-up schematic cross-sectional side view illustration of the inside mesa trench of FIG. 10C in accordance with an embodiment.

FIGS. 10A-10C are schematic cross-sectional side view illustrations of another method of forming and passivating an inside mesa trench with two etching operations in accordance with an embodiment. Specifically, oxidation of the OA layer 122 may be an intermediate operation between two separate trench etching operations. FIG. 10D is a close-up schematic cross-sectional side view illustration of the inside mesa trench of FIG. 10C in accordance with an embodiment. The processing sequence of FIG. 10A-10C may proceed similarly as the processing sequence of FIG. 9A-9C, with a difference being the second etching operation to complete formation of the inside mesa trench 130 results in a step surface 136. In such an embodiment, a photoresist mask may be utilized during the second etching operation where area of the inside mesa trench 130 opening is reduced. This reduced area may hence produce a smaller area at the bottom surface 137 of the inside mesa trench 130 where aluminum-containing layers could potentially be subjected to secondary oxidation that can occur from other processing sources other than the OA layer 122 oxidation operation.

Referring to FIG. 10D, the resulting emitter structure can include secondary oxidation regions 127 similarly as described with regard to FIG. 9D, where the secondary oxidation regions are limited to layers above the OA layer 122. Further the etching sequence may result in an inside mesa trench 130 that includes stepped sidewalls including top sidewalls 132 spanning the inside mesa trench to a depth of at least the OA layer 122 (and preferably not through the next aluminum-containing layer), and bottom sidewalls 134 spanning a portion of the top DBR layer 120 beneath the OA layer 122, where the top sidewalls 132 are wider apart than the bottom sidewalls 134 and the oxidized portion 123 of the OA layer 122 extends directly from the top sidewalls 132. As shown, a step surface 136 may extend from a bottom of the top sidewalls 132 to a top of the bottom sidewalls 134. The step surface 136 may be of a semiconductor layer directly beneath the OA layer 122, such as a non-aluminum-containing higher refractive index layer 124 (e.g. GaAs).

Figure 11:
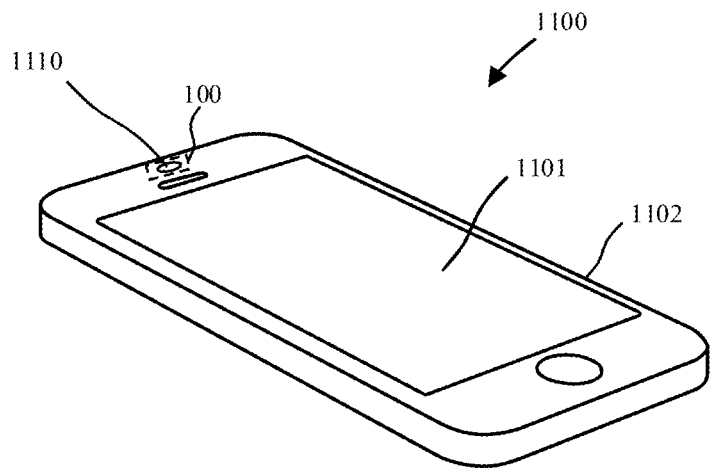
FIG. 11 is an isometric view of a mobile telephone in accordance with an embodiment.
Figure 12:
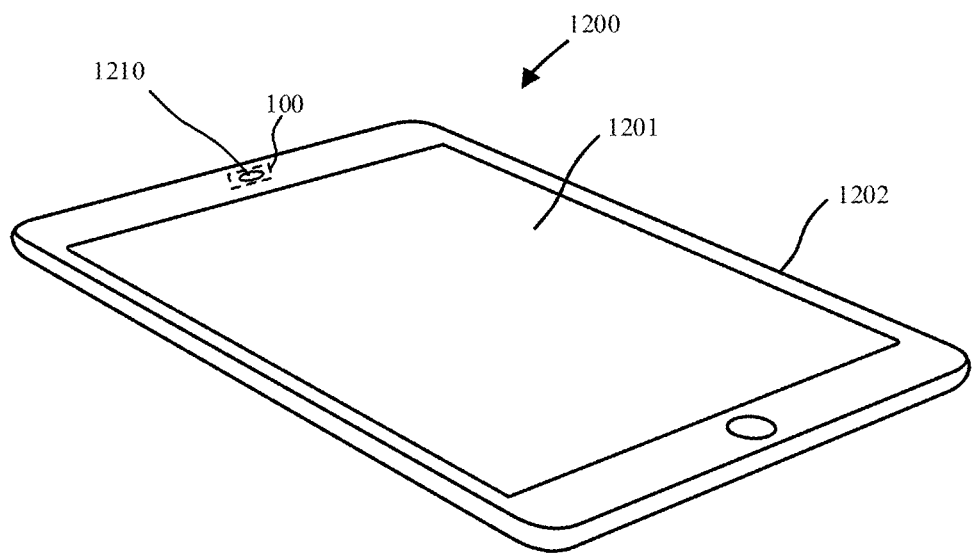
FIG. 12 is an isometric view of a tablet computing device in accordance with an embodiment.
Figure 13:
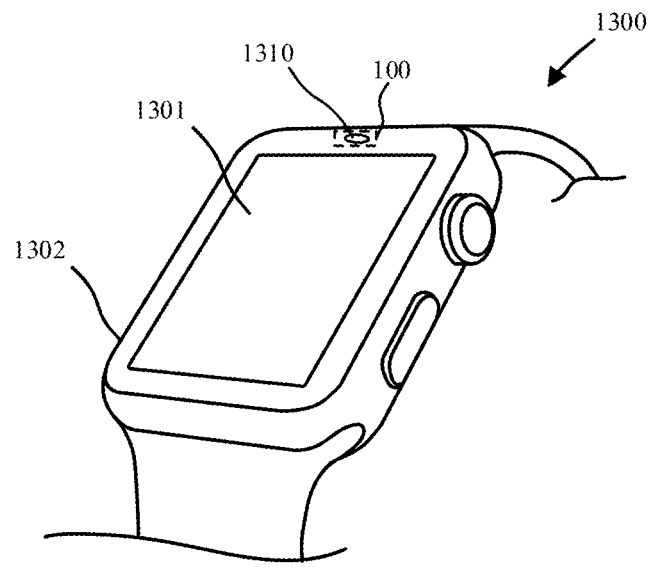
FIG. 13 is an isometric view of a wearable device in accordance with an embodiment.
Figure 14:
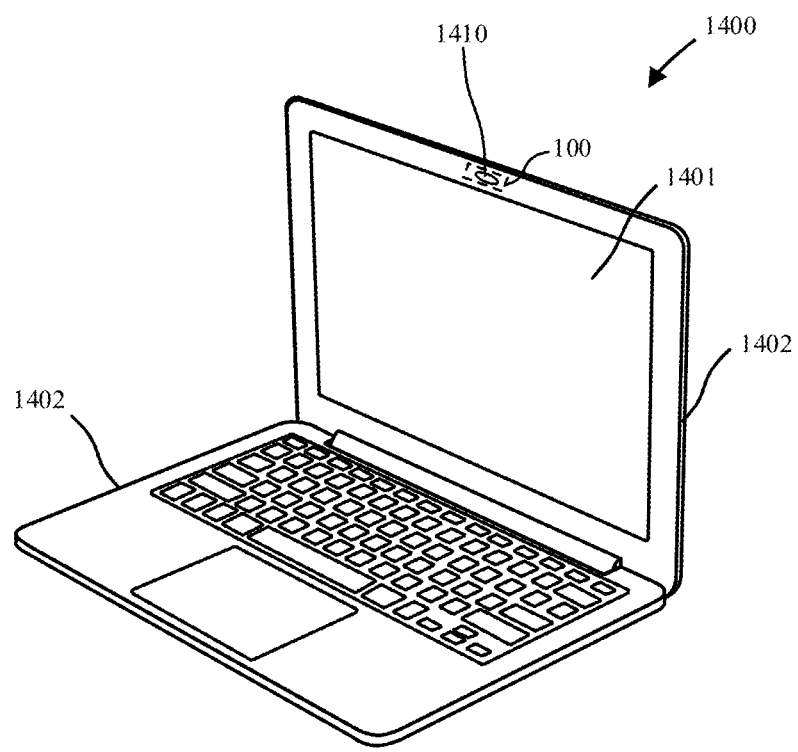
FIG. 14 is an isometric view of a laptop computer in accordance with an embodiment.

FIGS. 11-14 illustrate various portable electronic devices in which the various embodiments can be implemented. FIG. 11 illustrates an exemplary mobile telephone 1100 that includes a display screen 1101 packaged in a housing 1102 and one or more windows 1110 to which the emitter structures 100 described herein can be aligned adjacently. FIG. 12 illustrates an exemplary tablet computing device 1200 that includes a display screen 1201 packaged in a housing 1202 and one or more windows 1210 to which the emitter structures 100 described herein can be aligned adjacently. FIG. 13 illustrates an exemplary wearable device 1300 that includes a display screen 1301 packaged in a housing 1302 and one or more windows 1310 to which the emitter structures 100 described herein can be aligned adjacently. FIG. 14 illustrates an exemplary laptop computer 1400 that includes a display screen 1401 packaged in a housing 1402 and one or more windows 1410 to which the emitter structures 100 described herein can be aligned adjacently.

Figure 15:
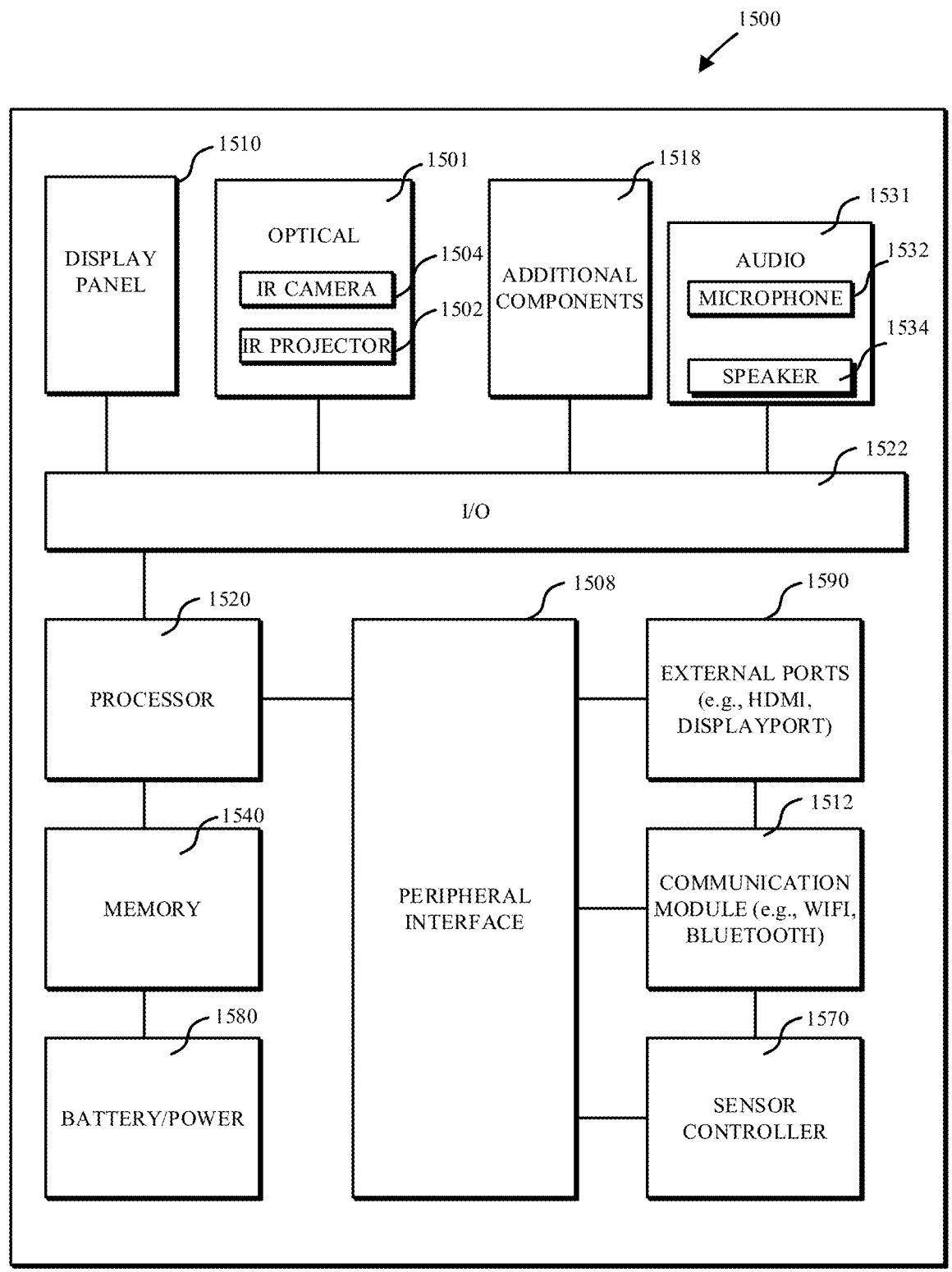
FIG. 15 is a system diagram of a portable electronic device in accordance with an embodiment.

FIG. 15 illustrates a system diagram for an embodiment of a portable electronic device 1500 including an emitter structure 100 described herein. The portable electronic device 1500 includes a processor 1520 and memory 1540 for managing the system and executing instructions. The memory includes non-volatile memory, such as flash memory, and can additionally include volatile memory, such as static or dynamic random access memory (RAM). The memory 1540 can additionally include a portion dedicated to read only memory (ROM) to store firmware and configuration utilities.

The system also includes a power module 1580 (e.g., flexible batteries, wired or wireless charging circuits, etc.), a peripheral interface 1508, and one or more external ports 1590 (e.g., Universal Serial Bus (USB), HDMI, Display Port, and/or others). In one embodiment, the portable electronic device 1500 includes a communication module 1512 configured to interface with the one or more external ports 1590. For example, the communication module 1512 can include one or more transceivers functioning in accordance with IEEE standards, 3GPP standards, or other communication standards, 4G, 5G, etc. and configured to receive and transmit data via the one or more external ports 1590. The communication module 1512 can additionally include one or more WWAN transceivers configured to communicate with a wide area network including one or more cellular towers, or base stations to communicatively connect the portable electronic device 1500 to additional devices or components. Further, the communication module 1512 can include one or more WLAN and/or WPAN transceivers configured to connect the portable electronic device 1500 to local area networks and/or personal area networks, such as a Bluetooth network.

In one embodiment the system includes an audio module 1531 including one or more speakers 1534 for audio output and one or more microphones 1532 for receiving audio. In embodiments, the speaker 1534 and the microphone 1532 can be piezoelectric components. The portable electronic device 1500 further includes an input/output (I/O) controller 1522, a display panel 1510 including display screen, and additional components 1518 (e.g., keys, buttons, lights, LEDs, cursor control devices, haptic devices, etc.). The display panel 1510 and the additional components 1518 may be considered to form portions of a user interface (e.g., portions of the portable electronic device 1500 associated with presenting information to the user and/or receiving inputs from the user).

In one embodiment the system includes an optical module 1501 including one or more of camera, IR camera 1504, IR projector 1502, proximity sensor, ambient light sensor, etc. In particular, the IR projector 1502 may include an emitter structure 100 described herein. The portable electronic device 1500 can further include a sensor controller 1570 to manage input from one or more sensors such as, for example, proximity sensors, ambient light sensors, infrared transceivers (e.g. from IR camera 1504, IR projector 1502) described herein.

In utilizing the various aspects of the embodiments, it would become apparent to one skilled in the art that combinations or variations of the above embodiments are possible for forming a trenched emitter structure for dense VCSEL design. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An emitter structure comprising:
    an emitter cluster comprising a non-uniform distribution of emitters comprising a common bottom DBR layer shared with each emitter in the emitter cluster and a top DBR layer, the top DBR layer including an oxide aperture (OA) layer, each emitter comprising:
        an inside mesa trench in the top DBR layer, and defining a top DBR layer mesa structure laterally interior to the inside mesa trench;
        wherein the OA layer for each top DBR layer mesa structure includes a non-oxidized portion and an oxidized portion extending from a sidewall of the inside mesa trench into the top DBR layer mesa structure; and
    one or more outside moat trenches in the top DBR layer, each outside moat trench adjacent to the inside mesa trench for one or more emitters in the emitter cluster, wherein each outside moat trench extends to a depth past the OA layer in the top DBR layer;
    wherein the OA layer intersecting each inside mesa trench in the top DBR layer is selectively oxidized, and the OA layer intersecting each outside moat trench in the top DBR layer is non-oxidized.

2. The emitter structure of claim 1, wherein the one or more outside moat trenches includes a first moat trench running laterally between a first plurality of emitters and a second plurality of emitters.

3. The emitter structure of claim 2, wherein the first moat trench intersects an inside mesa trench for at least one emitter.

4. The emitter structure of claim 1, wherein the one or more outside moat trenches includes a first set of one or more outside moat trenches completely laterally surrounding a first subcluster of emitters of the emitter cluster.

5. The emitter structure of claim 1, wherein the emitter cluster is partitioned into a plurality of emitter subclusters by the one or more outside moat trenches, each emitter subcluster including a connected OA layer.

6. The emitter structure of claim 1, wherein a plurality of the one or more outside moat trenches are intersected.

7. The emitter structure of claim 6, wherein the inside mesa trench completely surrounds the top DBR mesa structure.

8. The emitter structure of claim 6, wherein the inside mesa trench is a pattern of non-connected inside mesa trenches.

9. The emitter structure of claim 8, wherein a first outside moat trench of the one or more outside moat trenches completely surrounds the inside mesa trench and the top DBR mesa structure for one or more emitters of the emitter cluster.

10. The emitter structure of claim 8, wherein the one or more outside moat trenches includes a pattern of non-connected outside moat trenches.

11. The emitter structure of claim 1, wherein the oxidized portion of the OA layer for a first emitter of the emitter cluster intersects a sidewall of a first outside moat trench of the one or more outside moat trenches.

12. The emitter structure of claim 1, further comprising a passivation layer over the top DBR layer mesa structure, within the inside mesa trench for each emitter, and within the one or more outside moat trenches.

13. The emitter structure of claim 12, wherein the passivation layer is thicker within the one or more outside moat trenches than within the inside mesa trench for each emitter.

14. The emitter structure of claim 12, wherein the passivation layer comprises a lower passivation layer and an upper passivation layer on top of the lower passivation layer, and wherein the lower passivation layer spans within the one or more outside moat trenches, and the upper passivation layer spans within both the inside mesa trench for each emitter and within the one or more outside moat trenches.

15. The emitter structure of claim 1, wherein the inside mesa trench for a first emitter of the emitter cluster includes stepped sidewalls, comprising top sidewalls spanning the inside mesa trench to a depth of at least the OA layer, and bottom sidewalls spanning a portion of the top DBR layer beneath the OA layer, wherein the top sidewalls are wider apart than the bottom sidewalls and the oxidized portion of the OA layer extends directly from the top sidewalls.

16. The emitter structure of claim 15, further comprising a step surface extending from a bottom of the top sidewalls to a top of the bottom sidewalls, wherein the step surface is of a semiconductor layer directly beneath the OA layer.

17. The emitter structure of claim 1, wherein the top DBR layer includes alternating aluminum-containing layers and non-aluminum-containing layers, including a closest aluminum-containing layer above the OA layer and a closest aluminum-containing layer below the OA layer, wherein the closest aluminum-containing layer above the OA layer and along opposite sidewalls of the inside mesa trench for a first emitter is oxidized more than the closest aluminum-containing layer below the OA layer and along the opposite sidewalls of the inside mesa trench for the first emitter.

18. The emitter structure of claim 1, wherein the emitter structure is within an infrared (IR) projector of a mobile electronic device.

19. An emitter structure comprising:
an emitter cluster comprising plurality of emitters with a common bottom distributed Bragg reflector (DBR) layer shared with each emitter in the plurality of emitters and a top DBR layer, the top DBR layer including an oxide aperture (OA) layer, alternating aluminum-containing layers and non-aluminum-containing layers, including a closest aluminum-containing layer above the OA layer and a closest aluminum-containing layer below the OA layer, each emitter comprising:
an inside mesa trench in the top DBR layer, and defining a top DBR layer mesa structure laterally interior to the inside mesa trench; and
wherein the OA layer for each top DBR layer mesa structure includes a non-oxidized portion and an oxidized portion extending from opposite sidewalls of the inside mesa trench;
wherein the closest aluminum-containing layer above the OA layer and along the opposite sidewalls of the inside mesa trench is oxidized more than the closest aluminum-containing layer below the OA layer and along the opposite sidewalls of the inside mesa trench.

20. The emitter structure of claim 19, wherein the inside mesa trench for each emitter includes stepped sidewalls, comprising top sidewalls spanning the inside mesa trench to a depth of at least the OA layer, and bottom sidewalls spanning a portion of the top DBR layer beneath the OA layer, wherein the top sidewalls are wider apart than the bottom sidewalls and the oxidized portion of the OA layer extends directly from the top sidewalls.

21. The emitter structure of claim 20, further comprising a step surface extending from a bottom of the top sidewalls to a top of the bottom sidewalls, wherein the step surface is of a semiconductor layer directly beneath the OA layer.

22. The emitter structure of claim 19, within an infrared (IR) projector of a mobile electronic device.

* * * * *